US 12,306,041 B2

(12) United States Patent
Hashimoto

(10) Patent No.: US 12,306,041 B2
(45) Date of Patent: May 20, 2025

(54) ELECTRONIC DEVICE

(71) Applicant: Innolux Corporation, Miaoli County (TW)

(72) Inventor: Kazuyuki Hashimoto, Miaoli County (TW)

(73) Assignee: Innolux Corporation, Miaoli County (TW)

(*) Notice: Subject to any disclaimer, the term of this patent is extended or adjusted under 35 U.S.C. 154(b) by 0 days.

(21) Appl. No.: 18/733,887

(22) Filed: Jun. 5, 2024

(65) Prior Publication Data

US 2024/0328857 A1 Oct. 3, 2024

Related U.S. Application Data

(63) Continuation of application No. 17/896,063, filed on Aug. 25, 2022, now Pat. No. 12,038,323.

(60) Provisional application No. 63/287,545, filed on Dec. 9, 2021.

(51) Int. Cl.
*G01J 1/44* (2006.01)
*G01R 31/317* (2006.01)

(52) U.S. Cl.
CPC .......... *G01J 1/44* (2013.01); *G01J 2001/446* (2013.01); *G01R 31/31723* (2013.01)

(58) Field of Classification Search
CPC ................. G01J 1/44; G01J 2001/446; G01R 31/31723; H04N 25/67; H04N 25/77; H04B 1/18
See application file for complete search history.

(56) References Cited

U.S. PATENT DOCUMENTS

2016/0134789 A1* 5/2016 Inoue ..................... H04N 25/75
348/374
2018/0249109 A1* 8/2018 Yang ..................... H04N 25/771

* cited by examiner

*Primary Examiner* — Georgia Y Epps
*Assistant Examiner* — Monica T Taba
(74) *Attorney, Agent, or Firm* — JCIPRNET

(57) ABSTRACT

An electronic device is provided. The electronic device includes an electronic component, a sensing circuit, and a driving circuit. The sensing circuit is electrically connected to the electronic component through a sensing node. The sensing circuit includes a first transistor, a second transistor, and a third transistor. A control terminal of the first transistor is electrically connected to a terminal of the second transistor, and a terminal of the first transistor is electrically connected to another terminal of the second transistor. The third transistor is electrically connected to the first transistor. The driving circuit is electrically connected to the electronic component and the sensing circuit through the sensing node. The driving circuit includes a compensation transistor.

8 Claims, 17 Drawing Sheets

ELECTRONIC DEVICE

CROSS-REFERENCE TO RELATED APPLICATION

This application is a continuation application of and claims the priority benefit of a prior application Ser. No. 17/896,063, filed on Aug. 25, 2022, which claims the priority benefit of U.S. provisional application Ser. No. 63/287,545, filed on Dec. 9, 2021. The entirety of each of the above-mentioned patent applications is hereby incorporated by reference herein and made a part of this specification.

BACKGROUND

Technical Field

The disclosure relates to a circuit, in particular, to an electronic device.

Description of Related Art

In general, an antenna having a tunable element (ex: varactor) and a sensing device having a sensing element (ex: photodiode), both may be consisted by the active-matrix pixel and the tunable element is voltage-biased by a voltage source circuit. The voltage source circuit is realized with a source follower amplifier, which keeps bias voltage with a current to compensate a leak current of the tunable element. However, how to realize the driving, test or sensing function of the tunable element or the sensing element, and how to effectively read-out the driving, test or sensing result of the tunable element or the sensing element are important issues in the art.

SUMMARY

The electronic device of the disclosure includes an electronic component, a sensing circuit, and a driving circuit. The sensing circuit is electrically connected to the electronic component through a sensing node. The sensing circuit includes a first transistor, a second transistor, and a third transistor. A control terminal of the first transistor is electrically connected to a terminal of the second transistor, and a terminal of the first transistor is electrically connected to another terminal of the second transistor. The third transistor is electrically connected to the first transistor. The driving circuit is electrically connected to the electronic component and the sensing circuit through the sensing node. The driving circuit includes a compensation transistor.

Based on the above, according to the electronic device of the disclosure, the electronic device can be applied to testing and calibration of the active matrix voltage-controlled device (e.g. varactor antenna), or the read-out circuit of the active matrix sensing device/circuit (e.g. fingerprint sensor and X-ray flat-panel detector (FPD)).

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3 is a schematic diagram of an electronic device according to an embodiment of the disclosure.
FIG. 5 is a schematic diagram of an electronic device according to an embodiment of the disclosure.

DESCRIPTION OF THE EMBODIMENTS

Figure 1:
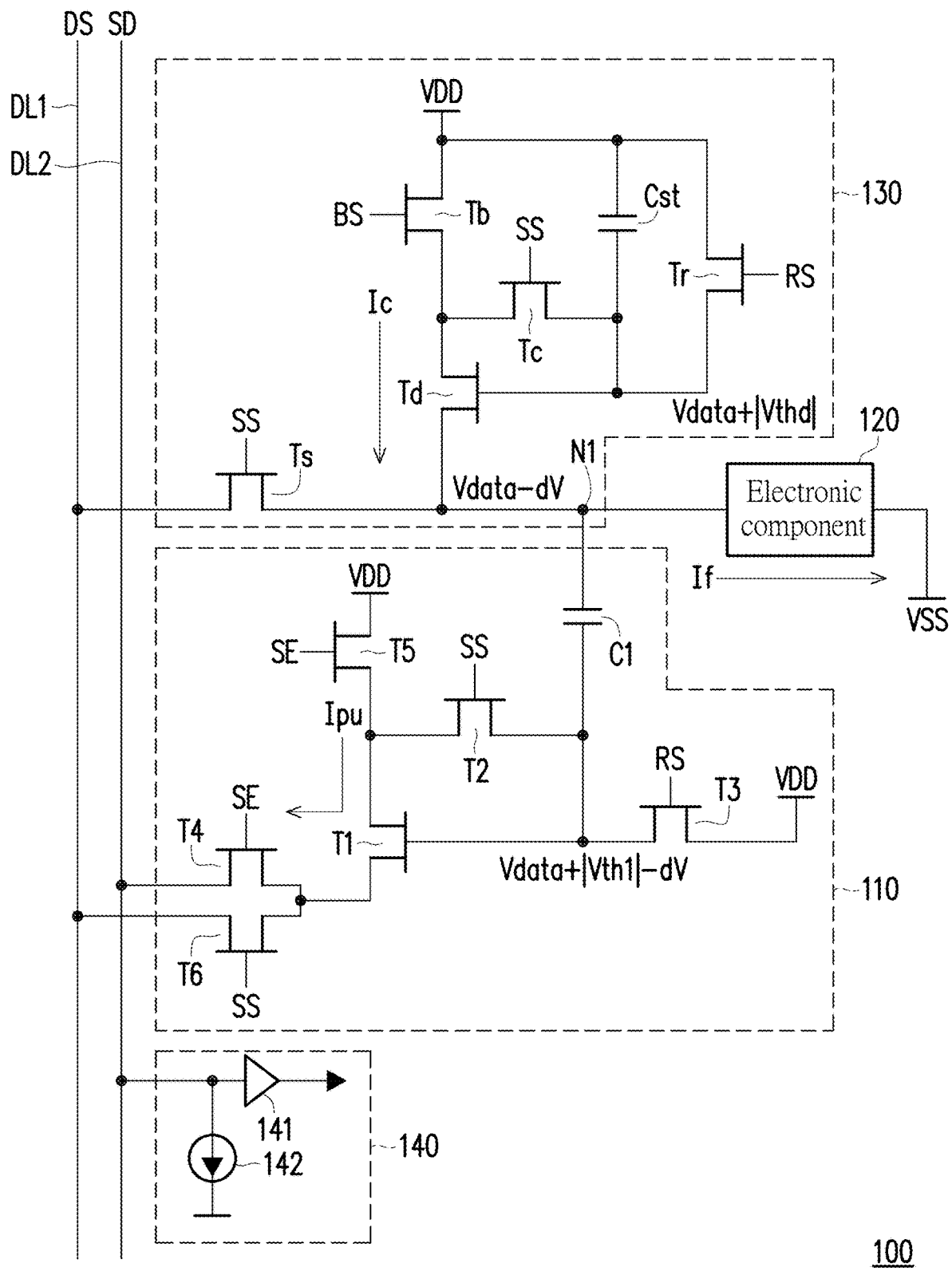
FIG. 1 is a schematic diagram of an electronic device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or electrically connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

The electronic device of the disclosure may include, for example, an antenna pixel circuit or a sensor pixel circuit, and the electronic component may correspond to an antenna unit of one pixel of the antenna pixel or a sensor unit of one pixel of the sensor pixel. The electronic component of the disclosure may be, for example, a voltage-controlled device in the antenna pixel or a photo-sensitive device in the sensor pixel of a fingerprint sensor or an X-ray flat-panel detector (FPD). The voltage-controlled device may include a tunable element and the tunable element may include, for example, a varactor, a photodiode, a resistor, an inductor or a capacitor, but the disclosure dose not limited thereto. The photo-sensitive device may include a sensing element and the sensing element may include, for example, a photodiode, a photoresistor, a phototransistor or a metal-semiconductor-metal photodetector, but the disclosure dose not limited thereto. It should be noted that, the electronic device of the disclosure may be manufactured using a display panel process, and related transistors and electronic components are fabricated on a glass substrate.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

FIG. 1 is a schematic diagram of an electronic device according to an embodiment of the disclosure. Referring to FIG. 1, the electronic device 100 includes a sensing circuit 110, an electronic component 120, a driving circuit 130, a read-out circuit 140, a control data line DL1 and a sense data line DL2. The sensing circuit 110 is electronically connected to the control data line DL1 and the sense data line DL2. The electronic component 120 is electronically connected to the sensing circuit 110 and the driving circuit 130 through the sensing node N1. The driving circuit 130 is electronically connected to the control data line DL1. The read-out circuit 140 is electronically connected to the sense data line DL2. The driving circuit 130 may be a programmable voltage source, and the driving circuit 130 may be programmed by a data voltage Vdata provided from the control data line DL1.

In the embodiment of the disclosure, the sensing circuit 110 includes a first transistor T1, a second transistor T2, a third transistor T3, a fourth transistor T4, a fifth transistor T5, a sixth transistor T6 and a capacitor C1. A first terminal of the first transistor T1 is electrically connected to a first terminal of the second transistor T2. A second terminal of the second transistor T2 is electrically connected to a control terminal of the first transistor T1 and a first terminal of the third transistor T3. The second transistor T2 is electrically between the capacitor C1 and a control terminal of the first transistor T1. A control terminal of the second transistor T2 is electrically connected to a scan signal SS. The first terminal and the second terminal of the second transistor T2 are electrically connected between the first terminal and the control terminal of the first transistor T1. A second terminal of the third transistor T3 is electrically connected to a first operation voltage VDD. A control terminal of the third transistor T3 is electrically connected to a reset signal RS. A first terminal of the fourth transistor T4 is electrically connected to the sense data line DL2. A second terminal of the fourth transistor T4 is electrically connected to a second terminal of the first transistor T1. A control terminal of the fourth transistor T4 is electrically connected to a sense control signal SE. A first terminal of the fifth transistor T5 is electrically connected to the first operation voltage VDD. A second terminal of the fifth transistor T5 is electrically connected to the first terminal of the first transistor T1 and the first terminal of the second transistor T2. A control terminal of the fifth transistor T5 is electrically connected to the sense control signal SE. A first terminal of the sixth transistor T6 is electrically connected to the control data line DL1. A second terminal of the sixth transistor T6 is electrically connected to the second terminals of the first transistor T1 and the second terminal of the fourth transistor T4. A control terminal of the sixth transistor T6 is electrically connected to the scan signal SS. A first terminal of the capacitor C1 is electrically connected to the sensing node N1. A second terminal of the capacitor C1 is electrically connected to the second terminal of the second transistor T2 and the control terminal of the first transistor T1. The capacitor C1 is electrically connected between the sensing node N1 and the control terminal of the first transistor T1.

In the embodiment of the disclosure, the driving circuit 130 includes a drive transistor Td, a scan transistor Ts, a bias transistor Tb, a compensation transistor Tc, a reset transistor Tr and a storage capacitor Cst. A first terminal of the drive transistor Td is electrically connected to a first terminal of the compensation transistor Tc. A second terminal of the drive transistor Td is electrically connected to the sensing node N1 and the scan transistor Ts. A control terminal of the drive transistor Td is electrically connected to a second terminal of the compensation transistor Tc. A control terminal of the compensation transistor Tc is electrically connected to the scan signal SS. A first terminal of the scan transistor Ts is electrically connected to the control data line DL1. A second terminal of the scan transistor Ts is electrically connected to the second terminal of the drive transistor Td and the sensing node N1. A control terminal of the scan transistor Ts is electrically connected to the scan signal SS. A first terminal of the bias transistor Tb is electrically connected to the first operation voltage VDD. A second terminal of the bias transistor Tb is electrically connected to the first terminals of the drive transistor Td and the first terminal of the compensation transistor Tc. A control terminal of the bias transistor Tb is electrically connected to a bias signal BS. A first terminal of the reset transistor Tr is electrically connected to the first operation voltage VDD. A second terminal of the reset transistor Tr is electrically connected to the control terminal of the drive transistor Td. A control terminal of the reset transistor Tr is electrically connected to the reset signal RS. A first terminal of the storage capacitor Cst is electrically connected to the first operation voltage VDD. A second terminal of the storage capacitor Cst is electrically connected to the second terminal the compensation transistor Tc and the control terminal of the drive transistor Td.

In the embodiment of the disclosure, the electronic component 120 is electrically connected between the sensing node N1 and a second operation voltage VSS. In the embodiment of the disclosure, the read-out circuit 140 includes a voltage amplifier 141 and a bias current source 142. An input terminal of the voltage amplifier 141 is electrically connected to the sense data line DL2 and the bias current source 142. An output terminal of the voltage amplifier 141 may output the sense result by receive a sense data from the sense data line DL2. The bias current source 142 is electrically connected between the input terminal of the voltage amplifier 141 and a voltage (e.g. the second operation voltage or a ground voltage).

In the embodiment of the disclosure, the electronic component 120 may be a tunable element. The active matrix voltage-controlled device (e.g. varactor antenna) may include a tunable element. The driving circuit 130 may be configured to drive the electronic component 120 for testing or calibration, and the sensing circuit 110 may be configured to sense the driving result or the test result of the electronic component 120, so that the read-out circuit 140 may be configured to read-out the driving result or the test result by the sense data line DL2. In the embodiment of the disclosure, the sensing circuit 110, the electronic component 120 and the driving circuit 130 may be disposed in an active area of the electronic device 100. The read-out circuit 140 may be disposed in a surrounding area outside of the active area of the electronic device 100.

In the embodiment of the disclosure, the above transistors may be N-type transistors, respectively, and the first operation voltage VDD may be greater than the second operation voltage VSS, but the disclosure dose not limited thereto. In addition, the first terminal and the second terminal of the above transistor may include the drain terminal and the source terminal of the transistor, and the control terminal of the above transistor may be the gate terminal of the transistor.

Figure 2:
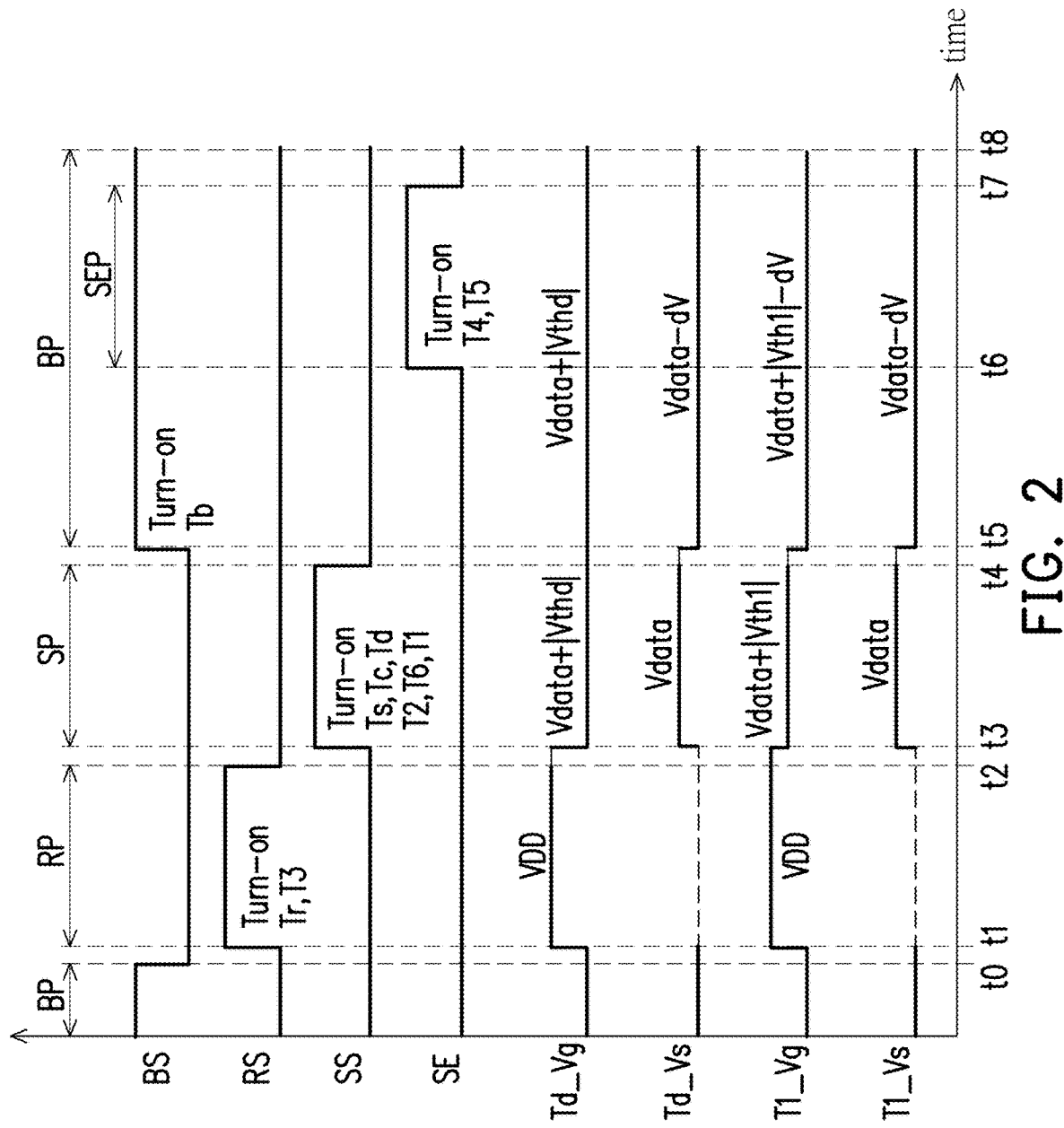
FIG. 2 is a timing diagram of related voltages and signals according to the embodiment of FIG. 1 of the disclosure.

FIG. 2 is a timing diagram of related voltages and signals according to the embodiment of FIG. 1 of the disclosure. Referring to FIG. 1 and FIG. 2, as shown as FIG. 2, the electronic device 100 may perform a bias operation, a reset operation, a scan operation and a sense operation during a bias period BP, a reset period RP, a scan period SP and a sense period SEP. In the reset period RP from time t1 to time t2, the reset signal RS may be at a high voltage level, and the bias signal BS, the scan signal SS and the sense signal SE may be at a low voltage level. Thus, the third transistor T3 and the reset transistor Tr are turned-on. The voltage Td_Vg of the control terminal (gate terminal) of the drive transistor Td may be reset to the first operation voltage VDD, and the voltage T1_Vg of the control terminal (gate terminal) of the first transistor T1 may be reset to the first operation voltage VDD.

In the scan period SP from time t3 to time t4, the scan signal SS may be at the high voltage level, and the bias signal BS, the reset signal RS and the sense signal SE may be at the low voltage level. Thus, the first transistor T1, the second transistor T2, the sixth transistor T6, the drive transistor Td, the scan transistor Ts and the compensation transistor Tc are turned-on. The sixth transistor T6 provides the control data signal DS from the control data line DL1 to the second terminal (source terminal) of the first transistor T1, so the voltage T1_Vs of the second terminal (source terminal) of the first transistor T1 may be the data voltage Vdata. The first transistor T1 may be turned-on by the first operation voltage VDD reset in the reset period RP, and the second transistor T2 turned-on by the scan signal SS, so the voltage T1_Vg of the control terminal of the first transistor T1 may be the voltage of the data voltage Vdata plus a threshold voltage |Vth1| of the first transistor T1. The scan transistor Ts provides the control data signal DS from the control data line DL1 to the second terminal (source terminal) of the drive transistor Td, so the voltage Td_Vs of the second terminal (source terminal) of the drive transistor Td may be the data voltage Vdata. The drive transistor Td may be turned-on by the first operation voltage VDD reset in the reset period RP, and the compensation transistor Tc turned-on by the scan signal SS, so the voltage Ts_Vg of the control terminal of the drive transistor Td may be the voltage of the data voltage Vdata plus a threshold voltage |Vthd| of the drive transistor Td.

In the bias period BP from time t5 to time t8 (and before time t0), the bias signal BS may be at the high voltage level, and the scan signal SS, the reset signal RS and the sense signal SE may be at the low voltage level. Thus, the bias transistor Tb is turned-on. The bias transistor Tb may provide the first operation voltage VDD to the first terminal (drain terminal) of the drive transistor Td, and the voltage Td_Vg of the control terminal (gate terminal) of the drive transistor Td may be the voltage of the data voltage Vdata plus a threshold voltage |Vthd| of the drive transistor Td provided by the storage capacitor Cst, so that the drive transistor Td is turned-on to drive the electronic component 120, and the threshold voltage |Vthd| of the drive transistor Td may be compensated. A leak current If may be generated, and the leak current If flows from the sensing node N1 to the second operation voltage VSS through the electronic component 120. When the current balance state is occurred, the drive transistor Td may be fixed to provide a compensation current Ic to the sensing node N1 to compensate the leak current If, so the voltage Td_Vs of the second terminal (source terminal) of the drive transistor Td may be the voltage of the data voltage Vdata minus a voltage dV caused by the compensation current Ic. Moreover, the capacitor C1 may couple the voltage of the sensing node N1 to the control terminal (gate terminal) of the first transistor T1. The voltage T1_Vg of the control terminal (gate terminal) of the first transistor T1 may be the voltage of the data voltage Vdata plus a threshold voltage |Vth1| of the first transistor T1 provided by the capacitor C1 and minus the voltage dV coupled by the capacitor C1. The threshold voltage |Vth1| of the first transistor T1 may be compensated, so that the voltage T1_Vs of the second terminal (source terminal) of the first transistor T1 may be the voltage of the data voltage Vdata minus the voltage dV.

In the sense period SEP from time t6 to time t7, the sense signal SE may be changed to the high voltage level. The sense period SEP may be simultaneously operated during the bias period BP. Thus, the fourth transistor T4 and the fifth transistor T5 are turned-on. The fifth transistor T5 provides the first operation voltage VDD to the first transistor T1, and the first transistor T1 generates a pull-up current Ipu corresponding to the voltage T1_Vg of the control terminal (gate terminal) of the first transistor T1. The fourth transistor T4 transfers the voltage T1_Vs of the second terminal (source terminal) of the first transistor T1 to the sense date line DL2. It should be noted that the voltage T1_Vs of the second terminal (source terminal) of the first transistor T1 is equal to the voltage of the sensing node N1 (ie, the voltage Td_Vs of the second terminal (source terminal) of the drive transistor Td), and the voltage of the sensing node N1 corresponds to the leak current If flowing through the electronic component 120. That is, the read-out circuit 140 may receive the sense data signal SD from the sense date line DL2, so as to read-out the voltage of the sensing node N1 for the back-end processing circuit to obtain the driving state (test state) of the electronic component 120 by voltage mode, and further obtain the test result of the electronic component 120 by analyzing the voltage read-out result by the back-end processing circuit. Therefore, the electronic device 100 may effectively perform the test operation of the electronic component 120, and effectively read-out the test result of the electronic component 120 for realizing the calibration of the electronic component 120.

Figure 3:
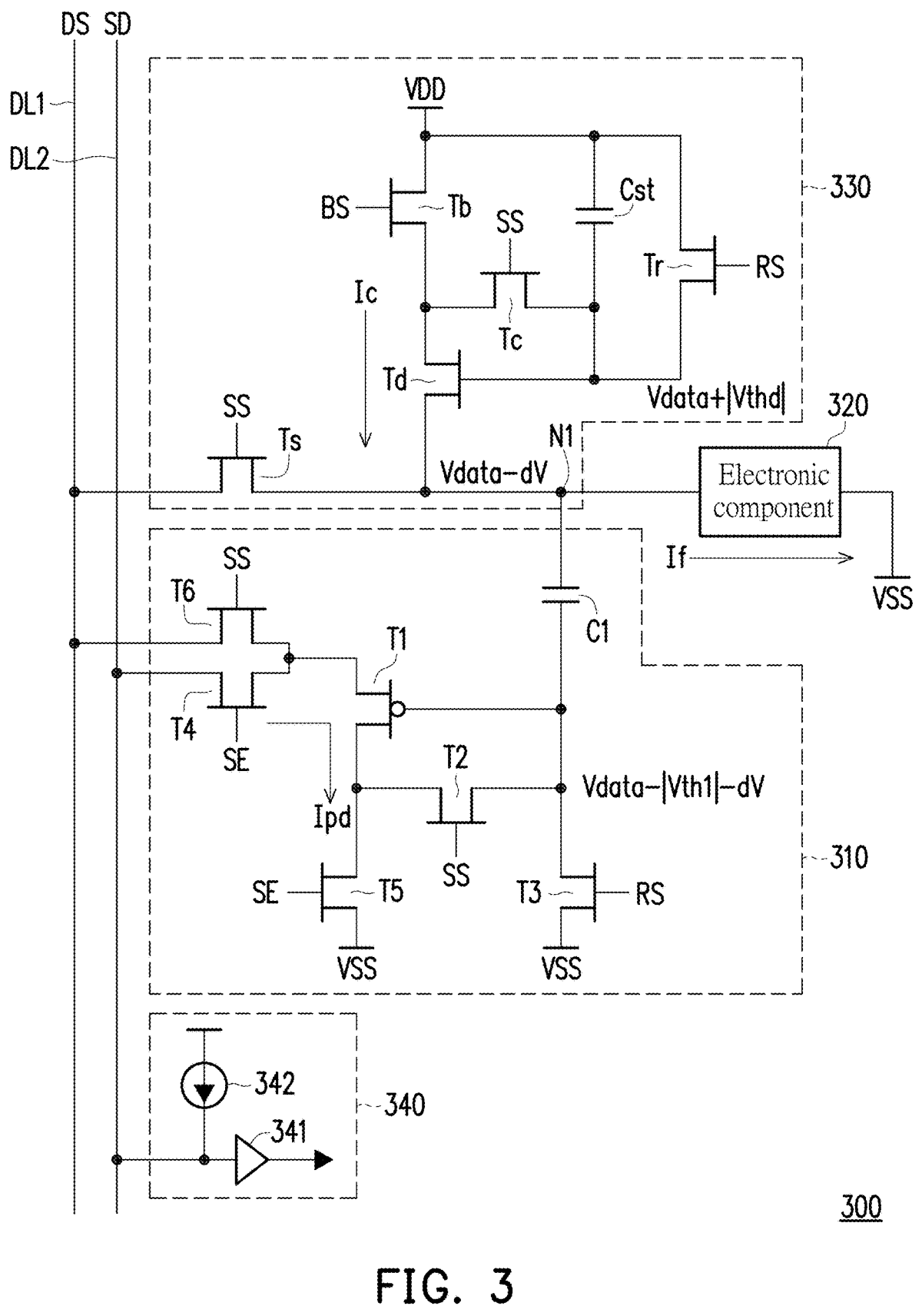

FIG. 3 is a schematic diagram of an electronic device according to an embodiment of the disclosure. Referring to FIG. 3, the electronic device 300 includes a sensing circuit 310, an electronic component 320, a driving circuit 330, a read-out circuit 340, a control data line DL1 and a sense data line DL2. The sensing circuit 310 is electronically connected to the control data line DL1 and the sense data line DL2. The electronic component 320 is electronically connected to the sensing circuit 310 and the driving circuit 330 through the sensing node N1. The driving circuit 330 is electronically connected to the control data line DL1. The read-out circuit 340 is electronically connected to the sense data line DL2. The driving circuit 330 may be a programmable voltage source, and the driving circuit 330 may be programmed by a data voltage Vdata provided from the control data line DL1.

In the embodiment of the disclosure, the sensing circuit 310 includes a first transistor T1, a second transistor T2, a third transistor T3, a fourth transistor T4, a fifth transistor T5, a sixth transistor T6 and a capacitor C1. A first terminal of the first transistor T1 is electrically connected to a first terminal of the second transistor T2 and a first terminal of the fifth transistor T5. A second terminal of the first transistor T1 is electrically connected to the fourth transistor T4 and the sixth transistor T6. A control terminal of the first transistor T1 is electrically connected to a second terminal of the second transistor T2, a first terminal of the third transistor T3 and the capacitor C1. A control terminal of the second transistor T2 is electrically connected to a scan signal SS. A second terminal of the third transistor T3 is electrically connected to a second operation voltage VSS. A control terminal of the third transistor T3 is electrically connected to a reset signal RS. A first terminal of the fourth transistor T4 is electrically connected to the sense data line DL2. A second terminal of the fourth transistor T4 is electrically connected to the second terminal of the first transistor T1. A control terminal of the fourth transistor T4 is electrically connected to a sense control signal SE. A second terminal of the fifth transistor T5 is electrically connected to the second operation voltage VSS. A control terminal of the fifth transistor T5 is electrically connected to the sense control signal SE. A first terminal of the sixth transistor T6 is electrically connected to the control data line DL1. A second terminal of the sixth transistor T6 is electrically connected to the first terminal of the first transistor T1. A control terminal of the sixth transistor T6 is electrically connected to the scan signal SS. A first terminal of the capacitor C1 is electrically connected to the sensing node N1. A second terminal of the capacitor C1 is electrically connected to the second terminal of the second transistor T2 and the control terminal of the first transistor T1.

In the embodiment of the disclosure, the driving circuit 330 includes a drive transistor Td, a scan transistor Ts, a bias transistor Tb, a compensation transistor Tc, a reset transistor Tr and a storage capacitor Cst. A first terminal of the drive transistor Td is electrically connected to a first terminal of the compensation transistor Tc. A second terminal of the drive transistor Td is electrically connected to the sensing node N1 and the scan transistor Ts. A control terminal of the drive transistor Td is electrically connected to a second terminal of the compensation transistor Tc. A control terminal of the compensation transistor Tc is electrically connected to the scan signal SS. A first terminal of the scan transistor Ts is electrically connected to the control data line DL1. A second terminal of the scan transistor Ts is electrically connected to the second terminal of the drive transistor Td and the sensing node N1. A control terminal of the scan transistor Ts is electrically connected to the scan signal SS. A first terminal of the bias transistor Tb is electrically connected to the first operation voltage VDD. A second terminal of the bias transistor Tb is electrically connected to the first terminals of the drive transistor Td and the first terminal of the compensation transistor Tc. A control terminal of the bias transistor Tb is electrically connected to a bias signal BS. A first terminal of the reset transistor Tr is electrically connected to the first operation voltage VDD. A second terminal of the reset transistor Tr is electrically connected to the control terminal of the drive transistor Td. A control terminal of the reset transistor Tr is electrically connected to the reset signal RS. A first terminal of the storage capacitor Cst is electrically connected to the first operation voltage VDD. A second terminal of the storage capacitor Cst is electrically connected to the second terminal the compensation transistor Tc and the control terminal of the drive transistor Td.

In the embodiment of the disclosure, the electronic component 320 is electrically connected between the sensing node N1 and the second operation voltage VSS. In the embodiment of the disclosure, the read-out circuit 340 includes a voltage amplifier 341 and a bias current source 342. An input terminal of the voltage amplifier 341 is electrically connected to the sense data line DL2 and the bias current source 342. An output terminal of the voltage amplifier 341 may output the sense result by receive a sense data from the sense data line DL2. The bias current source 342 is electrically connected between the input terminal of the voltage amplifier 341 and a voltage (e.g. the second operation voltage or a ground voltage).

In the embodiment of the disclosure, the electronic component 320 may be a tunable element. The active matrix voltage-controlled device (e.g. varactor antenna) may include a tunable element. The driving circuit 330 may be configured to drive the electronic component 320 for testing or calibration, and the sensing circuit 310 may be configured to sense the driving result or the test result of the electronic component 320, so that the read-out circuit 340 may be configured to read-out the driving result or the test result by the sense data line DL2. In the embodiment of the disclosure, the sensing circuit 310, the electronic component 320 and the driving circuit 330 may be disposed in an active area of the electronic device 300. The read-out circuit 340 may be disposed in a surrounding area outside of the active area of the electronic device 300.

In the embodiment of the disclosure, the first transistor T1 may be a P-type transistor, and the above other transistors may be the N-type transistors, respectively, and the first operation voltage VDD may be greater than the second operation voltage VSS, but the disclosure dose not limited thereto. In addition, the first terminal and the second terminal of the above transistor may include the drain terminal and the source terminal of the transistor, and the control terminal of the above transistor may be the gate terminal of the transistor.

Figure 4:
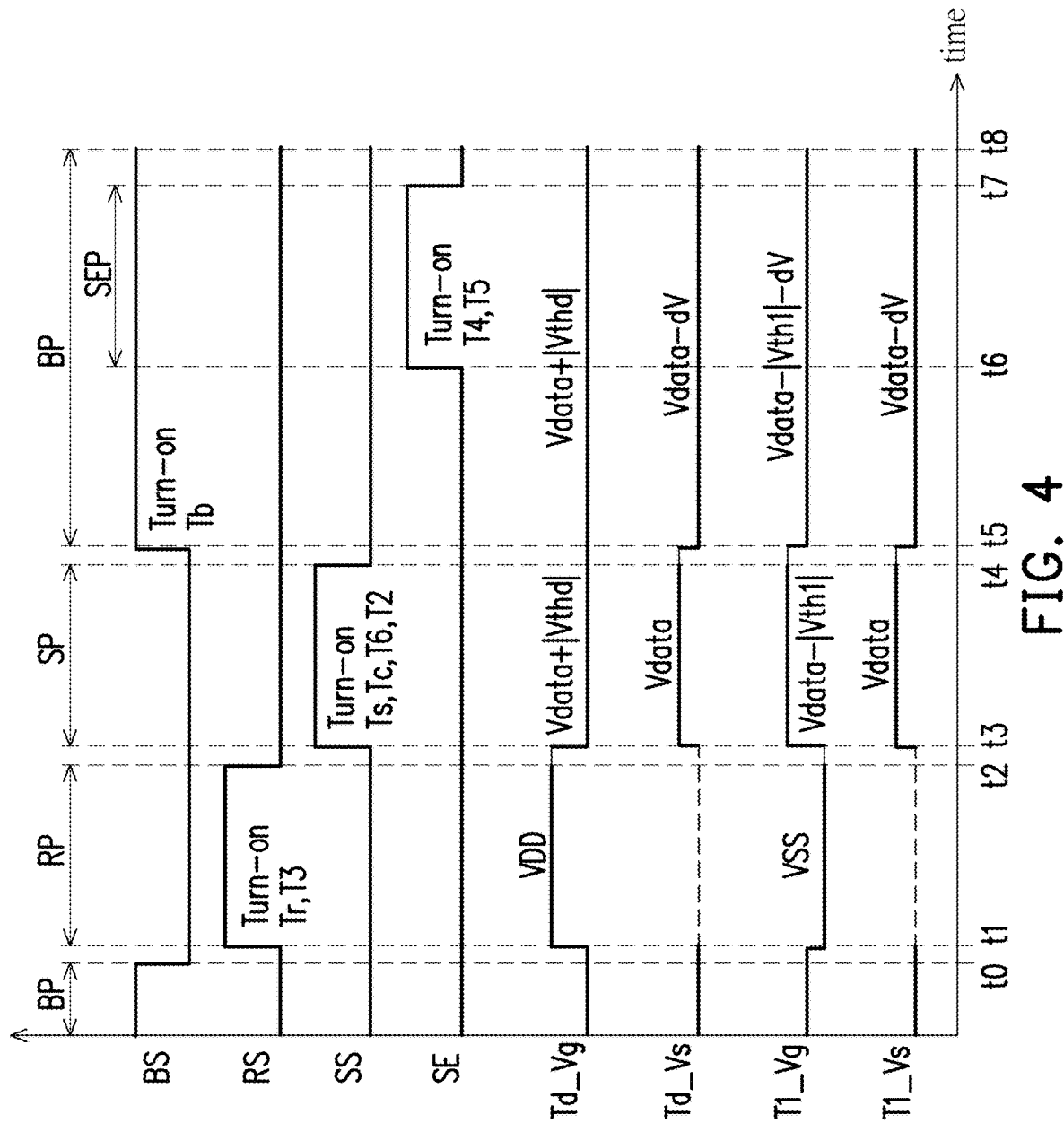
FIG. 4 is a timing diagram of related voltages and signals according to the embodiment of FIG. 3 of the disclosure.

FIG. 4 is a timing diagram of related voltages and signals according to the embodiment of FIG. 3 of the disclosure. Referring to FIG. 3 and FIG. 4, as shown as FIG. 4, the electronic device 300 may perform a bias operation, a reset operation, a scan operation and a sense operation during a bias period BP, a reset period RP, a scan period SP and a sense period SEP. In the reset period RP from time t1 to time t2, the reset signal RS may be at a high voltage level, and the bias signal BS, the scan signal SS and the sense signal SE may be at a low voltage level. Thus, the third transistor T3 and the reset transistor Tr are turned-on. The voltage Td_Vg of the control terminal (gate terminal) of the drive transistor Td may be reset to the first operation voltage VDD, and the voltage T1_Vg of the control terminal (gate terminal) of the first transistor T1 may be reset to the second operation voltage VSS.

In the scan period SP from time t3 to time t4, the scan signal SS may be at the high voltage level, and the bias signal BS, the reset signal RS and the sense signal SE may be at the low voltage level. Thus, the second transistor T2, the sixth transistor T6, the drive transistor Td, the scan transistor Ts and the compensation transistor Tc are turned-on. The sixth transistor T6 provides the control data signal DS from the control data line DL1 to the second terminal (source terminal) of the first transistor T1, so the voltage T1_Vs of the second terminal (source terminal) of the first transistor T1 may be the data voltage Vdata. The first transistor T1 may be turned-on by the second operation voltage VSS reset in the reset period RP, and the second transistor T2 turned-on by the scan signal SS, so the voltage T1_Vg of the control terminal of the first transistor T1 may be the voltage of the data voltage Vdata minus a threshold voltage |Vth1| of the first transistor T1. The scan transistor Ts provides the control data signal DS from the control data line DL1 to the second terminal (source terminal) of the drive transistor Td, so the voltage Td_Vs of the second terminal (source terminal) of the drive transistor Td may be the data voltage Vdata. The drive transistor Td may be turned-on by the first operation voltage VDD reset in the reset period RP, and the compensation transistor Tc turned-on by the scan signal SS, so the voltage Ts_Vg of the control terminal of the drive transistor Td may be the voltage of the data voltage Vdata plus a threshold voltage |Vthd| of the drive transistor Td.

In the bias period BP from time t5 to time t8 (and before time t0), the bias signal BS may be at the high voltage level, and the scan signal SS, the reset signal RS and the sense signal SE may be at the low voltage level. Thus, the bias transistor Tb is turned-on. The bias transistor Tb may provide the first operation voltage VDD to the first terminal (drain terminal) of the drive transistor Td, and the voltage Td_Vg of the control terminal (gate terminal) of the drive transistor Td may be the voltage of the data voltage Vdata plus a threshold voltage |Vthd| of the drive transistor Td provided by the storage capacitor Cst, so that the drive transistor Td is turned-on to drive the electronic component 320, and the threshold voltage |Vthd| of the drive transistor Td may be compensated. A leak current If may be generated, and the leak current If flows from the sensing node N1 to the second operation voltage VSS through the electronic component 320. When the current balance state is occurred, the drive transistor Td may be fixed to provide a compensation current Ic to the sensing node N1 to compensate the leak current If, so the voltage Td_Vs of the second terminal (source terminal) of the drive transistor Td may be the voltage of the data voltage Vdata minus a voltage dV caused by the compensation current Ic. Moreover, the capacitor C1 may couple the voltage of the sensing node N1 to the control terminal (gate terminal) of the first transistor T1. The voltage T1_Vg of the control terminal (gate terminal) of the first transistor T1 may be the voltage of the data voltage Vdata minus a threshold voltage |Vth1| of the first transistor T1 provided by the capacitor C1 and minus the voltage dV coupled by the capacitor C1. The threshold voltage |Vth1| of the first transistor T1 may be compensated, so that the voltage T1_Vs of the first terminal (source terminal) of the first transistor T1 may be the voltage of the data voltage Vdata minus the voltage dV.

In the sense period SEP from time t6 to time t7, the sense signal SE may be changed to the high voltage level. The sense period SEP may be simultaneously operated during the bias period BP. Thus, the fourth transistor T4 and the fifth transistor T5 are turned-on. The fifth transistor T5 provides the second operation voltage VSS to the first transistor T1, and the first transistor T1 generate a pull-down current Ipd corresponding to the voltage T1_Vg of the control terminal (gate terminal) of the first transistor T1. The fourth transistor T4 transfers the voltage T1_Vs of the first terminal (source terminal) of the first transistor T1 to the sense date line DL2. It should be noted that the voltage T1_Vs of the first terminal (source terminal) of the first transistor T1 is equal to the voltage of the sensing node N1 (ie, the voltage Td_Vs of the second terminal (source terminal) of the drive transistor Td), and the voltage of the sensing node N1 corresponds to the leak current If flowing through the electronic component 320. That is, the read-out circuit 340 may receive the sense data signal SD from the sense date line DL2, so as to read-out the voltage of the sensing node N1 for the back-end processing circuit to obtain the driving state (test state) of the electronic component 320 by voltage mode, and further obtain the test result of the electronic component 320 by analyzing the voltage read-out result by the back-end processing circuit. Therefore, the electronic device 300 may effectively perform the test operation of the electronic component 320, and effectively read-out the test result of the electronic component 320 for realizing the calibration of the electronic component 320.

Figure 5:
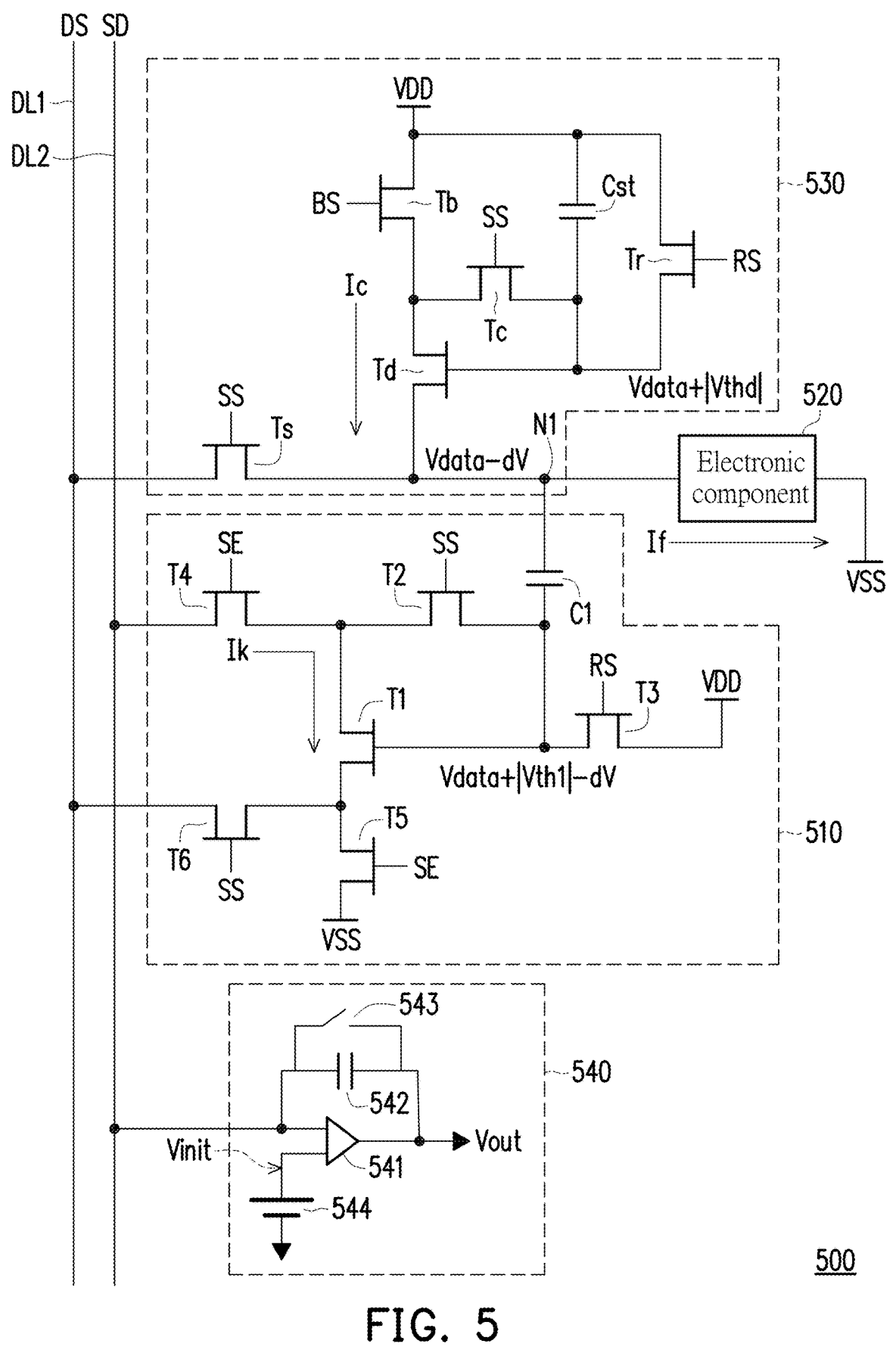

FIG. 5 is a schematic diagram of an electronic device according to an embodiment of the disclosure. Referring to FIG. 5, the electronic device 500 includes a sensing circuit 510, an electronic component 520, a driving circuit 530, a read-out circuit 540, a control data line DL1 and a sense data line DL2. The sensing circuit 510 is electronically connected to the control data line DL1 and the sense data line DL2. The electronic component 520 is electronically connected to the sensing circuit 510 and the driving circuit 530 through the sensing node N1. The driving circuit 530 is electronically connected to the control data line DL1. The read-out circuit 540 is electronically connected to the sense data line DL2. The driving circuit 530 may be a programmable voltage source, and the driving circuit 530 may be programmed by a data voltage Vdata provided from the control data line DL1.

In the embodiment of the disclosure, the sensing circuit 510 includes a first transistor T1, a second transistor T2, a third transistor T3, a fourth transistor T4, a fifth transistor T5, a sixth transistor T6 and a capacitor C1. A first terminal of the first transistor T1 is electrically connected to the second transistor T2 and the fourth transistor T4. A second terminal of the first transistor T1 is electrically connected to the fifth transistor T5 and the sixth transistor T6. A control terminal of the first transistor T1 is electrically connected to the second transistor T2, the third transistor T3 and the capacitor C1. A first terminal of the second transistor T2 is electrically connected to the first terminal of the first transistor T1 and the fourth transistor T4. A second terminal of the second transistor T2 is electrically connected to the control terminal of the first transistor T1 and a first terminal of the third transistor T3. The second transistor T2 is electrically connected between the first terminal and the control terminal of the first transistor T1. A control terminal of the second transistor T2 is electrically connected to a scan signal SS. A second terminal of the third transistor T3 is electrically connected to a first operation voltage VDD. A control terminal of the third transistor T3 is electrically connected to a reset signal RS. A first terminal of the fourth transistor T4 is electrically connected to the sense data line DL2. A second terminal of the fourth transistor T4 is electrically connected to the first terminal of the first transistor T1. A control terminal of the fourth transistor T4 is electrically connected to a sense control signal SE. A first terminal of the fifth transistor T5 is electrically connected to the second terminal of the first transistor T1 and the sixth transistor T6. A second terminal of the fifth transistor T5 is electrically connected to a second operation voltage VSS. A control terminal of the fifth transistor T5 is electrically connected to the sense control signal SE. A first terminal of the sixth transistor T6 is electrically connected to the control data line DL1. A second terminal of the sixth transistor T6 is electrically connected to the second terminal of the first transistor T1 and the first terminal of the fifth transistor T5. A control terminal of the sixth transistor T6 is electrically connected to the scan signal SS. A first terminal of the capacitor C1 is electrically connected to the sensing node N1. A second terminal of the capacitor C1 is electrically connected to the second terminal of the second transistor T2, the control terminal of the first transistor T1 and the first terminal of the third transistor T3.

In the embodiment of the disclosure, the driving circuit 530 includes a drive transistor Td, a scan transistor Ts, a bias transistor Tb, a compensation transistor Tc, a reset transistor Tr and a storage capacitor Cst. A first terminal of the drive transistor Td is electrically connected to a first terminal of the compensation transistor Tc. A second terminal of the drive transistor Td is electrically connected to the sensing node N1 and the scan transistor Ts. A control terminal of the drive transistor Td is electrically connected to a second terminal of the compensation transistor Tc. A control terminal of the compensation transistor Tc is electrically connected to the scan signal SS. A first terminal of the scan transistor Ts is electrically connected to the control data line DL1. A second terminal of the scan transistor Ts is electrically connected to the second terminal of the drive transistor Td and the sensing node N1. A control terminal of the scan transistor Ts is electrically connected to the scan signal SS. A first terminal of the bias transistor Tb is electrically connected to the first operation voltage VDD. A second terminal of the bias transistor Tb is electrically connected to the first terminals of the drive transistor Td and the compensation transistor Tc. A control terminal of the bias transistor Tb is electrically connected to a bias signal BS. A first terminal of the reset transistor Tr is electrically connected to the first operation voltage VDD. A second terminal of the reset transistor Tr is electrically connected to the control terminal of the drive transistor Td. A control terminal of the reset transistor Tr is electrically connected to the reset signal RS. A first terminal of the storage capacitor Cst is electrically connected to the first operation voltage VDD. A second terminal of the storage capacitor Cst is electrically connected to the second terminal the compensation transistor Tc and the control terminal of the drive transistor Td.

In the embodiment of the disclosure, the electronic component 520 is electrically connected between the sensing node N1 and a second operation voltage VSS. In the embodiment of the disclosure, the read-out circuit 540 includes an operational amplifier 541, a capacitor 542, a switch 543 and a reference voltage 544 to form a charge integrator. A first input terminal of the operational amplifier 541 is electrically connected to the sense data line DL2. A second input terminal of the operational amplifier 541 is electrically connected to the reference voltage 544. The capacitor 542 is electrically connected between the first input terminal and an output terminal of the operational amplifier 541. The switch 543 is electrically connected between the first input terminal and an output terminal of the operational amplifier 541. The output terminal of the operational amplifier 541 may output the sense result by receive a sense data from the sense data line DL2. The reference voltage 544 is electrically connected between the second input terminal of the operational amplifier 541 and a voltage (e.g. the second operation voltage or a ground voltage).

In the embodiment of the disclosure, the electronic component 520 may be a tunable element. The active matrix voltage-controlled device (e.g. varactor antenna) may include a tunable element. The driving circuit 530 may be configured to drive the electronic component 520 for testing or calibration, and the sensing circuit 510 may be configured to sense the driving result or the test result of the electronic component 520, so that the read-out circuit 540 may be configured to read-out the driving result or the test result by the sense data line DL2. In the embodiment of the disclosure, the sensing circuit 510, the electronic component 520 and the driving circuit 530 may be disposed in an active area of the electronic device 500. The read-out circuit 540 may be disposed in a surrounding area outside of the active area of the electronic device 500.

In the embodiment of the disclosure, the above transistors may be the N-type transistors, respectively, and the first operation voltage VDD may be greater than the second operation voltage VSS, but the disclosure dose not limited thereto. In addition, the first terminal and the second terminal of the above transistor may include the drain terminal and the source terminal of the transistor, and the control terminal of the above transistor may be the gate terminal of the transistor.

Figure 6:
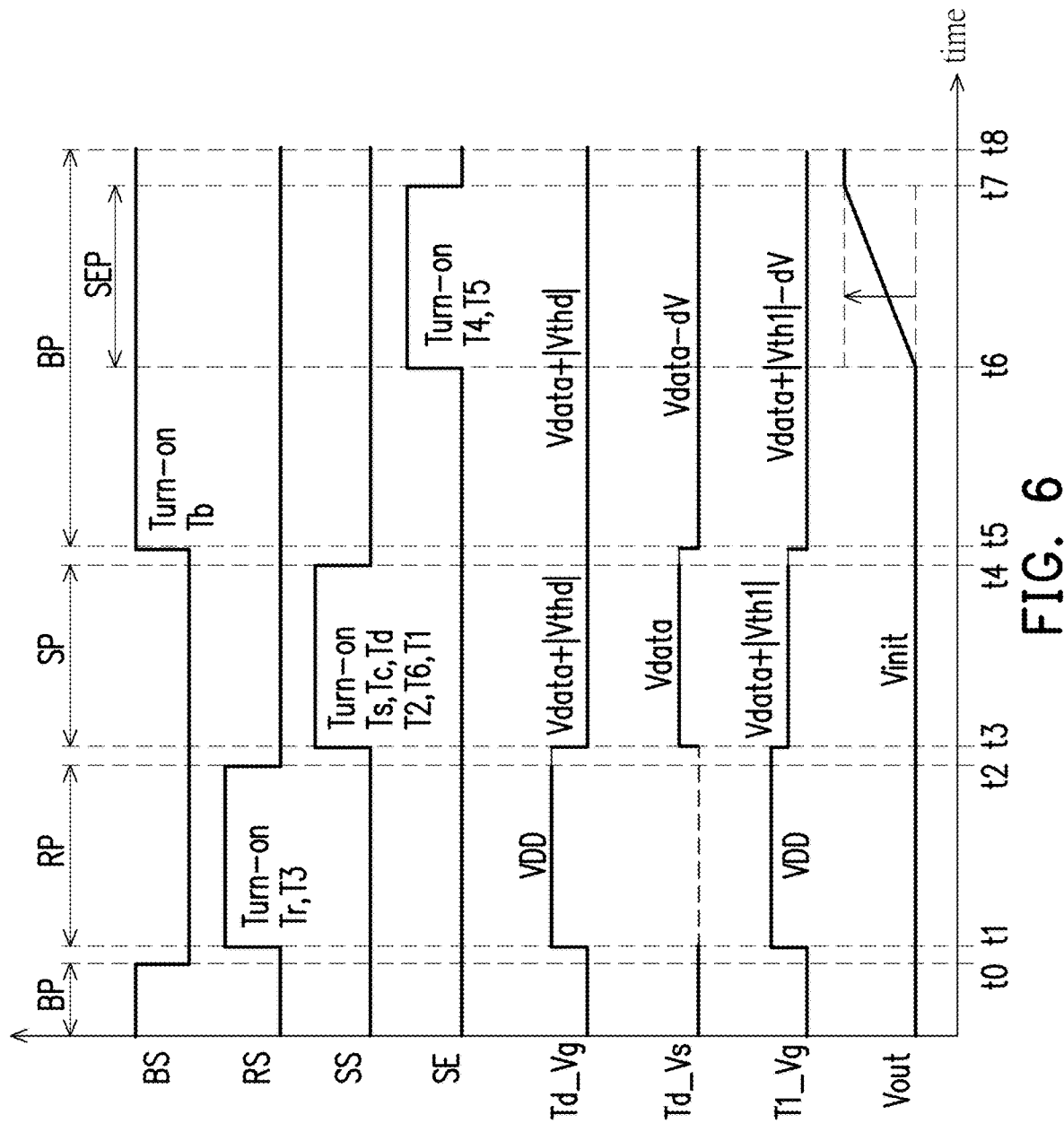
FIG. 6 is a timing diagram of related voltages and signals according to the embodiment of FIG. 5 of the disclosure.

FIG. 6 is a timing diagram of related voltages and signals according to the embodiment of FIG. 5 of the disclosure. Referring to FIG. 5 and FIG. 6, as shown as FIG. 6, the electronic device 500 may perform a bias operation, a reset operation, a scan operation and a sense operation during a bias period BP, a reset period RP, a scan period SP and a sense period SEP. In the reset period RP from time t1 to time t2, the reset signal RS may be at a high voltage level, and the bias signal BS, the scan signal SS and the sense signal SE may be at a low voltage level. Thus, the third transistor T3 and the reset transistor Tr are turned-on. The voltage Td_Vg of the control terminal (gate terminal) of the drive transistor Td may be reset to the first operation voltage VDD, and the voltage T1_Vg of the control terminal (gate terminal) of the first transistor T1 may be reset to the first operation voltage VDD.

In the scan period SP from time t3 to time t4, the scan signal SS may be at the high voltage level, and the bias signal BS, the reset signal RS and the sense signal SE may be at the low voltage level. Thus, the first transistor T1, the second transistor T2, the sixth transistor T6, the drive transistor Td, the scan transistor Ts and the compensation transistor Tc are turned-on. The sixth transistor T6 provides the control data signal DS from the control data line DL1 to the second terminal (source terminal) of the first transistor T1, so the voltage of the second terminal (source terminal) of the first transistor T1 may be the data voltage Vdata. The first transistor T1 may be turned-on by the first operation voltage VDD reset in the reset period RP, and the second transistor T2 turned-on by the scan signal SS, so the voltage T1_Vg of the control terminal of the first transistor T1 may be the voltage of the data voltage Vdata plus a threshold voltage |Vth1| of the first transistor T1. The scan transistor Ts provides the control data signal DS from the control data line DL1 to the second terminal (source terminal) of the drive transistor Td, so the voltage Td_Vs of the second terminal (source terminal) of the drive transistor Td may be the data voltage Vdata. The drive transistor Td may be turned-on by the first operation voltage VDD reset in the reset period RP, and the compensation transistor Tc turned-on by the scan signal SS, so the voltage Td_Vg of the control terminal of the drive transistor Td may be the voltage of the data voltage Vdata plus a threshold voltage |Vthd| of the drive transistor Td.

In the bias period BP from time t5 to time t8 (and before time t0), the bias signal BS may be at the high voltage level, and the scan signal SS, the reset signal RS and the sense signal SE may be at the low voltage level. Thus, the bias transistor Tb is turned-on. The bias transistor Tb may provide the first operation voltage VDD to the first terminal (drain terminal) of the drive transistor Td, and the voltage Td_Vg of the control terminal (gate terminal) of the drive transistor Td may be the voltage of the data voltage Vdata plus a threshold voltage |Vthd| of the drive transistor Td provided by the storage capacitor Cst, so that the drive transistor Td is turned-on to drive the electronic component 520, and the threshold voltage |Vthd| of the drive transistor Td may be compensated. A leak current If may be generated, and the leak current If flows from the sensing node N1 to the second operation voltage VSS through the electronic component 520. When the current balance state is occurred, the drive transistor Td may be fixed to provide a compensation current Ic to the sensing node N1 to compensate the leak current If, so the voltage Td_Vs of the second terminal (source terminal) of the drive transistor Td may be the voltage of the data voltage Vdata minus a voltage dV caused by the compensation current Ic. Moreover, the capacitor C1 may couple the voltage of the sensing node N1 to the control terminal (gate terminal) of the first transistor T1. The voltage T1_Vg of the control terminal (gate terminal) of the first transistor T1 may be the voltage of the data voltage Vdata plus a threshold voltage |Vth1| of the first transistor T1 provided by the capacitor C1 and minus the voltage dV coupled by the capacitor C1. The threshold voltage |Vth1| of the first transistor T1 may be compensated, so that the first transistor T1 may generate a current corresponding to the voltage of the data voltage Vdata minus the voltage dV.

In the sense period SEP from time t6 to time t7, the sense signal SE may be changed to the high voltage level. The sense period SEP may be simultaneously operated during the bias period BP. Thus, the fourth transistor T4 and the fifth transistor T5 are turned-on. The fifth transistor T5 provides the second operation voltage VSS to the first transistor T1, and the first transistor T1 generates a sink current Ik corresponding to the voltage of the data voltage Vdata minus the voltage dV. The fourth transistor T4 transfers the sink current Ik to the sense date line DL2. It should be noted that the sink current Ik corresponds to the voltage of the sensing node N1 (ie, the voltage Td_Vs of the second terminal (source terminal) of the drive transistor Td), and the voltage of the sensing node N1 corresponds to the leak current If flowing through the electronic component 520. The first input terminal of the read-out circuit 540 may receive the sense data signal SD with the sink current Ik from the sense date line DL2, and output an output voltage Vout by integrating the sink current Ik. Thus, the output voltage Vout may rise from a low voltage level of an initial voltage Vinit to a high voltage level. That is, the read-out circuit 540 may receive the sense data signal SD with the sink current Ik from the sense date line DL2, so as to read-out the voltage of the sensing node N1 for the back-end processing circuit to obtain the driving state (test state) of the electronic component 520 by current mode (ie, the sink current Ik is converted to voltage by the charge integrator), and further obtain the test result of the electronic component 520 by analyzing the read-out result of the sink current Ik by the back-end processing circuit. Therefore, the electronic device 500 may effectively perform the test operation of the electronic component 520, and effectively read-out the test result of the electronic component 520 for realizing the calibration of the electronic component 520.

Figure 7:
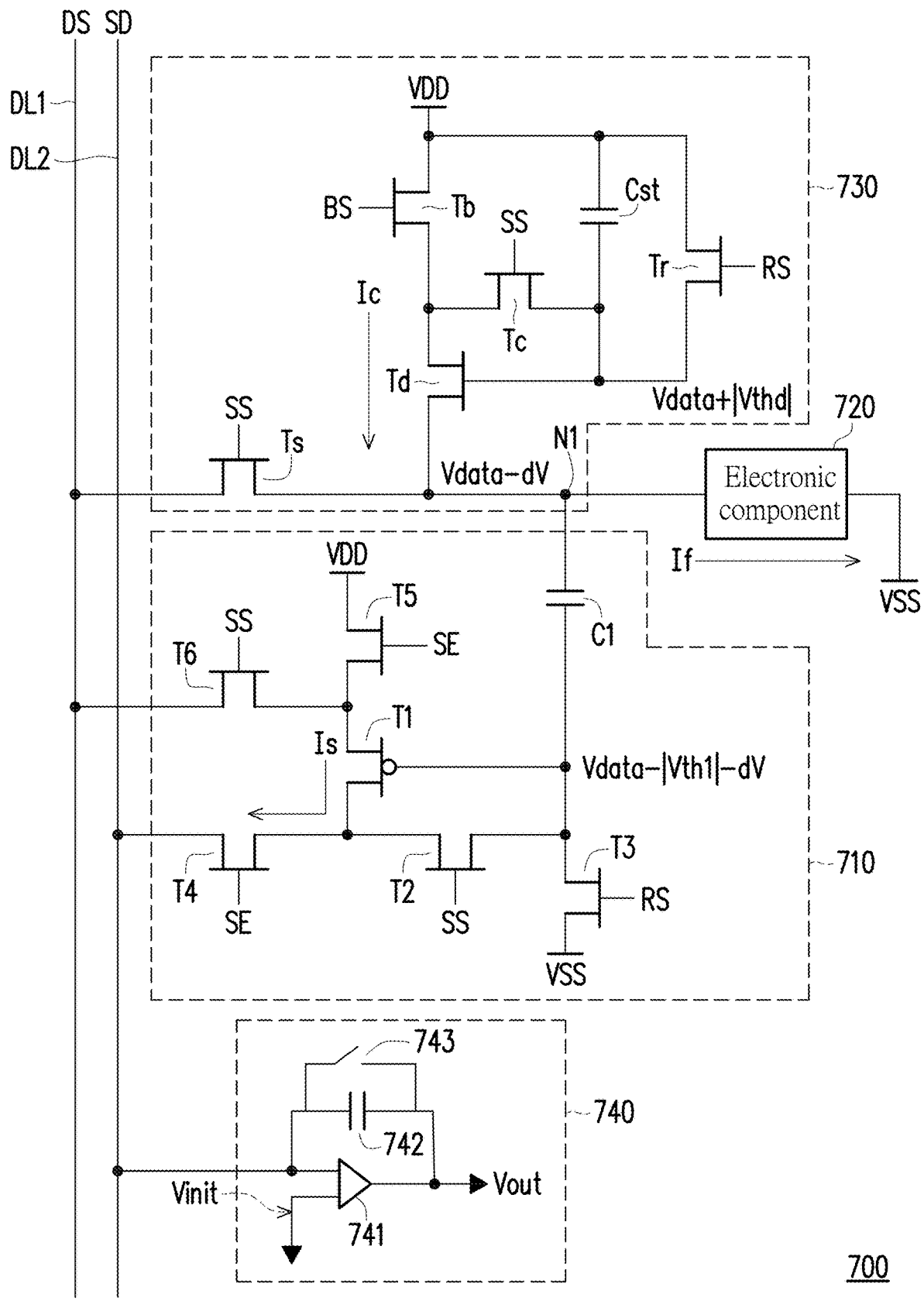
FIG. 7 is a schematic diagram of an electronic device according to an embodiment of the disclosure.

FIG. 7 is a schematic diagram of an electronic device according to an embodiment of the disclosure. Referring to FIG. 7, the electronic device 700 includes a sensing circuit 710, an electronic component 720, a driving circuit 730, a read-out circuit 740, a control data line DL1 and a sense data line DL2. The sensing circuit 710 is electronically connected to the control data line DL1 and the sense data line DL2. The electronic component 720 is electronically connected to the sensing circuit 710 and the driving circuit 730 through the sensing node N1. The driving circuit 730 is electronically connected to the control data line DL1. The read-out circuit 740 is electronically connected to the sense data line DL2. The driving circuit 730 may be a programmable voltage source, and the driving circuit 730 may be programmed by a data voltage Vdata provided from the control data line DL1.

In the embodiment of the disclosure, the sensing circuit 710 includes a first transistor T1, a second transistor T2, a third transistor T3, a fourth transistor T4, a fifth transistor T5, a sixth transistor T6 and a capacitor C1. A first terminal of the first transistor T1 is electrically connected to the second transistor T2 and the fourth transistor T4. A second terminal of the first transistor T1 is electrically connected to the fifth transistor T5 and the sixth transistor T6. A control terminal of the first transistor T1 is electrically connected to the second transistor T2 and the third transistor T3. A first terminal of the second transistor T2 is electrically connected to the first terminal of the first transistor T1 and the fourth transistor T4. A second terminal of the second transistor T2 is electrically connected to the control terminal of the first transistor T1 and a first terminal of the third transistor T3. The second transistor T2 is electrically connected between the first terminal and the control terminal of the first transistor T1. A control terminal of the second transistor T2 is electrically connected to a scan signal SS. A second terminal of the third transistor T3 is electrically connected to a second operation voltage VSS. A control terminal of the third transistor T3 is electrically connected to a reset signal RS. A first terminal of the fourth transistor T4 is electrically connected to the sense data line DL2. A second terminal of the fourth transistor T4 is electrically connected to the first terminal of the first transistor T1. A control terminal of the fourth transistor T4 is electrically connected to a sense control signal SE. A first terminal of the fifth transistor T5 is electrically connected to a first operation voltage VDD. A second terminal of the fifth transistor T5 is electrically connected to the second terminal of the first transistor T1 and the sixth transistor T6. A control terminal of the fifth transistor T5 is electrically connected to the sense control signal SE. A first terminal of the sixth transistor T6 is electrically connected to the control data line DL1. A second terminal of the sixth transistor T6 is electrically connected to the second terminal of the first transistor T1 and the second terminal of the fifth transistor T5. A control terminal of the sixth transistor T6 is electrically connected to the scan signal SS. A first terminal of the capacitor C1 is electrically connected to the sensing node N1. A second terminal of the capacitor C1 is electrically connected to the second terminal of the second transistor T2, the control terminal of the first transistor T1 and the first terminal of the third transistor T3.

In the embodiment of the disclosure, the driving circuit 730 includes a drive transistor Td, a scan transistor Ts, a bias transistor Tb, a compensation transistor Tc, a reset transistor Tr and a storage capacitor Cst. A first terminal of the drive transistor Td is electrically connected to a first terminal of the compensation transistor Tc. A second terminal of the drive transistor Td is electrically connected to the sensing node N1 and the scan transistor Ts. A control terminal of the drive transistor Td is electrically connected to a second terminal of the compensation transistor Tc. A control terminal of the compensation transistor Tc is electrically connected to the scan signal SS. A first terminal of the scan transistor Ts is electrically connected to the control data line DL1. A second terminal of the scan transistor Ts is electrically connected to the second terminal of the drive transistor Td and the sensing node N1. A control terminal of the scan transistor Ts is electrically connected to the scan signal SS. A first terminal of the bias transistor Tb is electrically connected to the first operation voltage VDD. A second terminal of the bias transistor Tb is electrically connected to the first terminals of the drive transistor Td and the compensation transistor Tc. A control terminal of the bias transistor Tb is electrically connected to a bias signal BS. A first terminal of the reset transistor Tr is electrically connected to the first operation voltage VDD. A second terminal of the reset transistor Tr is electrically connected to the control terminal of the drive transistor Td. A control terminal of the reset transistor Tr is electrically connected to the reset signal RS. A first terminal of the storage capacitor Cst is electrically connected to the first operation voltage VDD. A second terminal of the storage capacitor Cst is electrically connected to the second terminal the compensation transistor Tc and the control terminal of the drive transistor Td.

In the embodiment of the disclosure, the electronic component 720 is electrically connected between the sensing node N1 and a second operation voltage VSS. In the embodiment of the disclosure, the read-out circuit 740 includes an operational amplifier 741, a capacitor 742 and a switch 743 to form a charge integrator. A first input terminal of the operational amplifier 741 is electrically connected to the sense data line DL2. A second input terminal of the operational amplifier 741 is electrically connected to a voltage (e.g. the second operation voltage or a ground voltage). The capacitor 742 is electrically connected between the first input terminal and an output terminal of the operational amplifier 741. The switch 743 is electrically connected between the first input terminal and an output terminal of the operational amplifier 741. The output terminal of the operational amplifier 741 may output the sense result by receive a sense data from the sense data line DL2.

In the embodiment of the disclosure, the electronic component 720 may be a tunable element. The active matrix voltage-controlled device (e.g. varactor antenna) may include a tunable element. The driving circuit 730 may be configured to drive the electronic component 720 for testing or calibration, and the sensing circuit 710 may be configured to sense the driving result or the test result of the electronic component 720, so that the read-out circuit 740 may be configured to read-out the driving result or the test result by the sense data line DL2. In the embodiment of the disclosure, the sensing circuit 710, the electronic component 720 and the driving circuit 730 may be disposed in an active area of the electronic device 700. The read-out circuit 740 may be disposed in a surrounding area outside of the active area of the electronic device 700.

In the embodiment of the disclosure, the first transistor T1 may be the P-type transistor, and the above other transistors may be the N-type transistors, respectively, and the first operation voltage VDD may be greater than the second operation voltage VSS, but the disclosure dose not limited thereto. In addition, the first terminal and the second terminal of the above transistor may include the drain terminal and the source terminal of the transistor, and the control terminal of the above transistor may be the gate terminal of the transistor.

Figure 8:
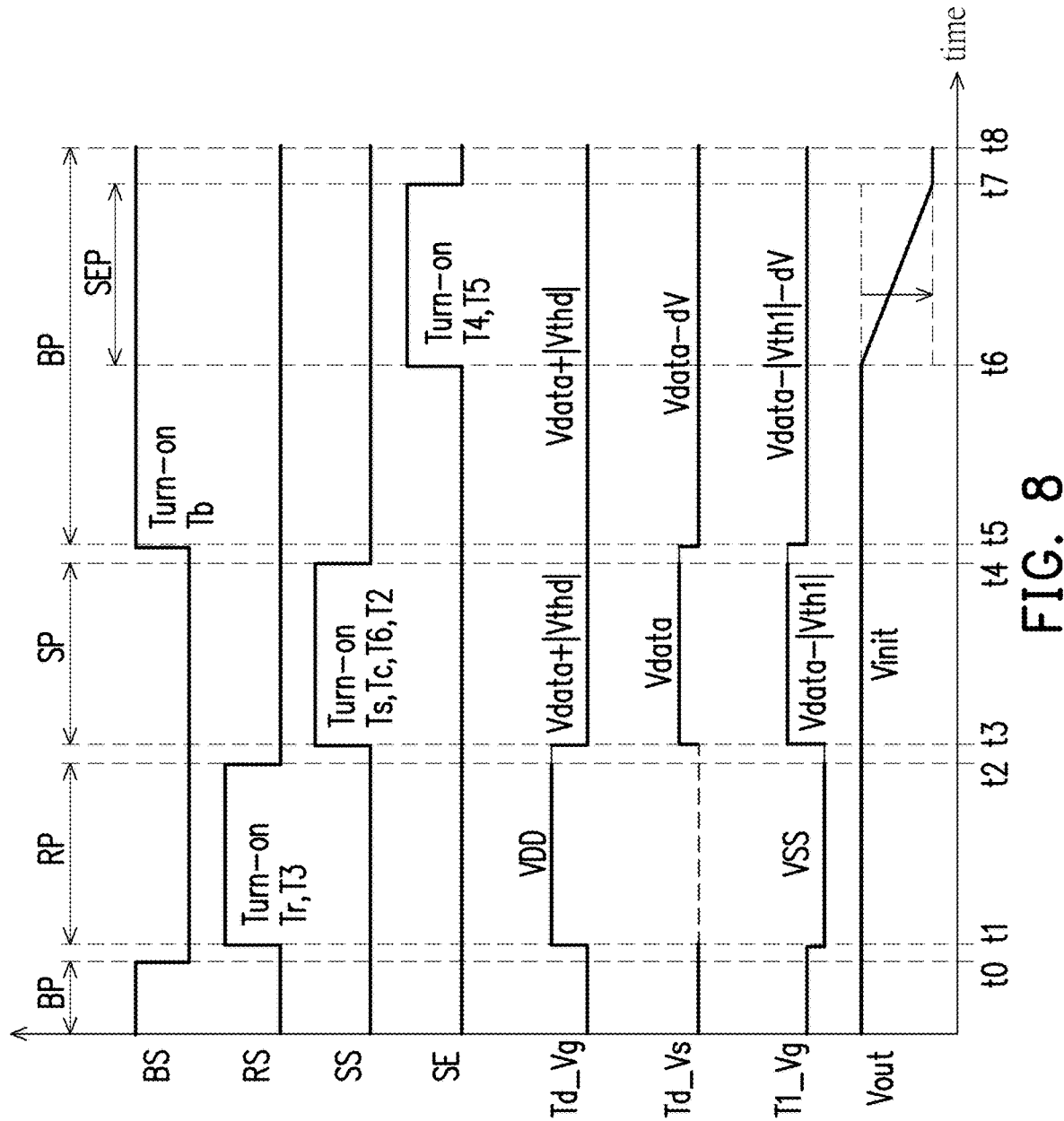
FIG. 8 is a timing diagram of related voltages and signals according to the embodiment of FIG. 7 of the disclosure.

FIG. 8 is a timing diagram of related voltages and signals according to the embodiment of FIG. 7 of the disclosure. Referring to FIG. 7 and FIG. 8, as shown as FIG. 8, the electronic device 700 may perform a bias operation, a reset operation, a scan operation and a sense operation during a bias period BP, a reset period RP, a scan period SP and a sense period SEP. In the reset period RP from time t1 to time t2, the reset signal RS may be at a high voltage level, and the bias signal BS, the scan signal SS and the sense signal SE may be at a low voltage level. Thus, the third transistor T3 and the reset transistor Tr are turned-on. The voltage Td_Vg of the control terminal (gate terminal) of the drive transistor Td may be reset to the first operation voltage VDD, and the voltage T1_Vg of the control terminal (gate terminal) of the first transistor T1 may be reset to the second operation voltage VSS.

In the scan period SP from time t3 to time t4, the scan signal SS may be at the high voltage level, and the bias signal BS, the reset signal RS and the sense signal SE may be at the low voltage level. Thus, the first transistor T1, the second transistor T2, the sixth transistor T6, the drive transistor Td, the scan transistor Ts and the compensation transistor Tc are turned-on. The sixth transistor T6 provides the control data signal DS from the control data line DL1 to the second terminal (source terminal) of the first transistor T1, so the voltage of the second terminal (source terminal) of the first transistor T1 may be the data voltage Vdata. The first transistor T1 may be turned-on by the second operation voltage VSS reset in the reset period RP, and the second transistor T2 turned-on by the scan signal SS, so the voltage T1_Vg of the control terminal of the first transistor T1 may be the voltage of the data voltage Vdata minus a threshold voltage |Vth1| of the first transistor T1. The scan transistor Ts provides the control data signal DS from the control data line DL1 to the second terminal (source terminal) of the drive transistor Td, so the voltage Td_Vs of the second terminal (source terminal) of the drive transistor Td may be the data voltage Vdata. The drive transistor Td may be turned-on by the first operation voltage VDD reset in the reset period RP, and the compensation transistor Tc turned-on by the scan signal SS, so the voltage Td_Vg of the control terminal of the drive transistor Td may be the voltage of the data voltage Vdata plus a threshold voltage |Vthd| of the drive transistor Td.

In the bias period BP from time t5 to time t8 (and before time t0), the bias signal BS may be at the high voltage level, and the scan signal SS, the reset signal RS and the sense signal SE may be at the low voltage level. Thus, the bias transistor Tb is turned-on. The bias transistor Tb may provide the first operation voltage VDD to the first terminal (drain terminal) of the drive transistor Td, and the voltage Td_Vg of the control terminal (gate terminal) of the drive transistor Td may be the voltage of the data voltage Vdata plus a threshold voltage |Vthd| of the drive transistor Td provided by the storage capacitor Cst, so that the drive transistor Td is turned-on to drive the electronic component 720, and the threshold voltage |Vthd| of the drive transistor Td may be compensated. A leak current If may be generated, and the leak current If flows from the sensing node N1 to the second operation voltage VSS through the electronic component 720. When the current balance state is occurred, the drive transistor Td may be fixed to provide a compensation current Ic to the sensing node N1 to compensate the leak current If, so the voltage Td_Vs of the second terminal (source terminal) of the drive transistor Td may be the voltage of the data voltage Vdata minus a voltage dV caused by the compensation current Ic. Moreover, the capacitor C1 may couple the voltage of the sensing node N1 to the control terminal (gate terminal) of the first transistor T1. The voltage T1_Vg of the control terminal (gate terminal) of the first transistor T1 may be the voltage of the data voltage Vdata minus a threshold voltage |Vth1| of the first transistor T1 provided by the capacitor C1 and minus the voltage dV coupled by the capacitor C1. The threshold voltage |Vth1| of the first transistor T1 may be compensated, so that the first transistor T1 may generate a current corresponding to the voltage of the data voltage Vdata minus the voltage dV.

In the sense period SEP from time t6 to time t7, the sense signal SE may be changed to the high voltage level. The sense period SEP may be simultaneously operated during the bias period BP. Thus, the fourth transistor T4 and the fifth transistor T5 are turned-on. The fifth transistor T5 provides the first operation voltage VDD to the first transistor T1, and the first transistor T1 generates a source current Is corresponding to the voltage of the data voltage Vdata minus the voltage dV. The fourth transistor T4 transfers the source current Is to the sense date line DL2. It should be noted that the source current Is corresponds to the voltage of the sensing node N1 (ie, the voltage Td_Vs of the second terminal (source terminal) of the drive transistor Td), and the voltage of the sensing node N1 corresponds to the leak current If flowing through the electronic component 720. The first input terminal of the read-out circuit 740 may receive the sense data signal SD with the source current Is from the sense date line DL2, and output an output voltage Vout by integrating the source current Is. Thus, the output voltage Vout may drop from a high voltage level of an initial voltage Vinit to a low voltage level. That is, the read-out circuit 740 may receive the sense data signal SD with the source current Is from the sense date line DL2, so as to read-out the voltage of the sensing node N1 for the back-end processing circuit to obtain the driving state (test state) of the electronic component 720 by current mode (ie, the source current Is is converted to voltage by the charge integrator), and further obtain the test result of the electronic component 720 by analyzing the read-out result of the source current Is by the back-end processing circuit. Therefore, the electronic device 700 may effectively perform the test operation of the electronic component 720, and effectively read-out the test result of the electronic component 720 for realizing the calibration of the electronic component 720.

Figure 9:
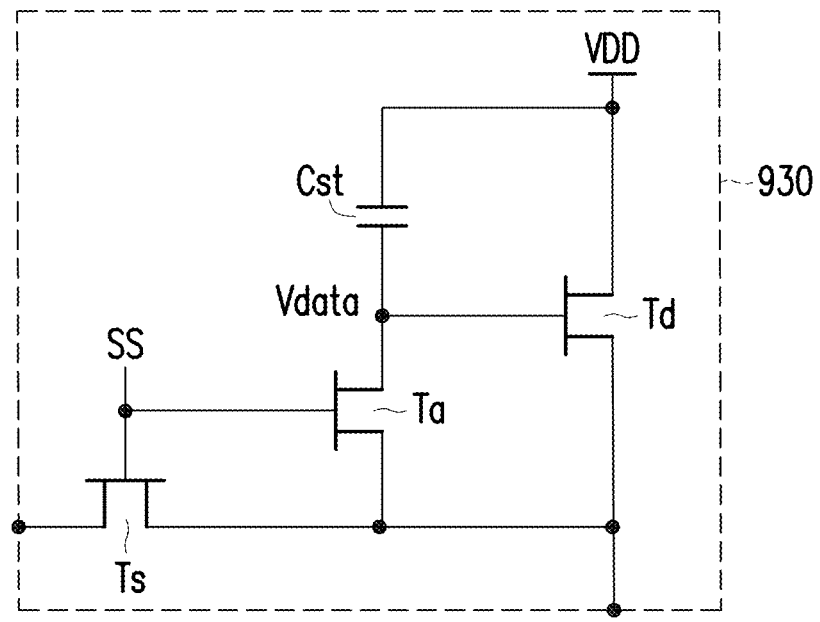
FIG. 9 is a schematic diagram of a driving circuit according to another embodiment of FIG. 7 of the disclosure.

FIG. 9 is a schematic diagram of a driving circuit according to another embodiment of FIG. 7 of the disclosure. Referring to FIG. 1, FIG. 3, FIG. 5, FIG. 7 and FIG. 9, in other embodiments of the disclosure, the driving circuit 130 of embodiment of FIG. 1, the driving circuit 330 of embodiment of FIG. 3, the driving circuit 530 of embodiment of FIG. 5, the driving circuit 730 of embodiment of FIG. 7 may be replaced with the driving circuit 930 of FIG. 9. As shown in FIG. 9, the driving circuit 930 includes a drive transistor Td, a scan transistor Ta, a scan transistor Ts and a storage capacitor Cst. A first terminal of the drive transistor Td is electrically connected to the first operation voltage VDD. A second terminal of the drive transistor Td is electrically connected to the scan transistor Ta, the scan transistor Ts and the sensing node N1 of FIG. 7 (FIG. 1, FIG. 3 or FIG. 5). A control terminal of the drive transistor Td is electrically connected to the scan transistor Ta and the storage capacitor Cst. A first terminal of the scan transistor Ta is electrically connected to the control terminal of the drive transistor Td and the storage capacitor Cst. A second terminal of the scan transistor Ta is electrically connected to the second terminal of the drive transistor Td, the scan transistor Ts and the sensing node N1 of FIG. 7 (FIG. 1, FIG. 3 or FIG. 5). A control terminal of the scan transistor Ta is electrically connected to the scan signal SS. A first terminal of the scan transistor Ts is electrically connected to the control data line DL1 of FIG. 7 (FIG. 1, FIG. 3 or FIG. 5). A second terminal of the scan transistor Ts is electrically connected to the second terminal of the drive transistor Td, the second terminal of the scan transistor Ta and the sensing node N1 of FIG. 7 (FIG. 1, FIG. 3 or FIG. 5). A control terminal of the scan transistor Ts is electrically connected to the scan signal SS. A first terminal of the storage capacitor Cst is electrically connected to the first operation voltage VDD. A second terminal of the storage capacitor Cst is electrically connected to the control terminal of the drive transistor Td and the first terminal of the scan transistor Ta.

In the embodiment of the disclosure, the drive transistor Td, the scan transistor Ta and the scan transistor Ts may be the N-type transistors, respectively, but the disclosure dose not limited thereto. In addition, the first terminal and the second terminal of the above transistor may include the drain terminal and the source terminal of the transistor, and the control terminal of the above transistor may be the gate terminal of the transistor.

Figure 10:
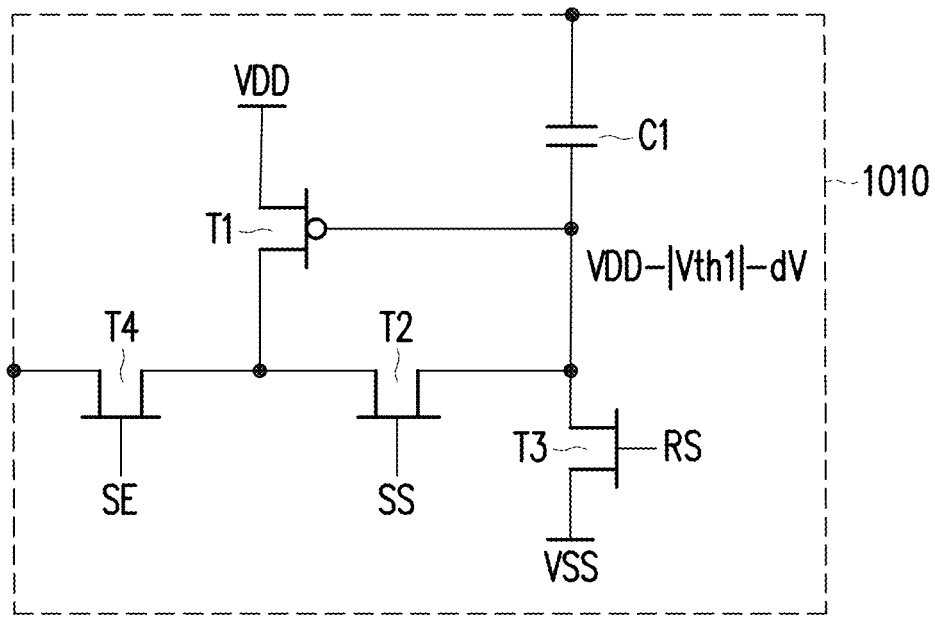
FIG. 10 is a schematic diagram of a sensing circuit according to another embodiment of FIG. 7 of the disclosure.

FIG. 10 is a schematic diagram of a sensing circuit according to another embodiment of FIG. 7 of the disclosure. Referring to FIG. 7 and FIG. 10, in other embodiments of the disclosure, the sensing circuit 710 of embodiment of FIG. 7 may be replaced with the sensing circuit 1010 of FIG. 10. As shown in FIG. 10, the sensing circuit 1010 includes a first transistor T1, a second transistor T2, a third transistor T3, a fourth transistor T4 and a capacitor C1. A first terminal of the first transistor T1 is electrically connected to the second transistor T2 and the fourth transistor T4. A second terminal of the first transistor T1 is electrically connected to the first operation voltage VDD. A control terminal of the first transistor T1 is electrically connected to the second transistor T2, the third transistor T3 and the capacitor C1. A first terminal of the second transistor T2 is electrically connected to the first terminal of the first transistor T1 and the fourth transistor T4. A second terminal of the second transistor T2 is electrically connected to the control terminal of the first transistor T1, the third transistor T3 and the capacitor C1. A control terminal of the second transistor T2 is electrically connected to the scan signal SS. A first terminal of the third transistor T3 is electrically connected to the control terminal of the first transistor T1, the second terminal of the second transistor T2 and the capacitor C1. A second terminal of the third transistor T3 is electrically connected to the second operation voltage VSS. A control terminal of the third transistor T3 is electrically connected to the reset signal RS. A first terminal of the fourth transistor T4 is electrically connected to the sense data line DL2 of FIG. 7. A second terminal of the fourth transistor T4 is electrically connected to the first terminal of the first transistor T1 and a first terminal of the second transistor T2. A control terminal of the fourth transistor T4 is electrically connected to the sense control signal SE. A first terminal of the capacitor C1 is electrically connected to the sensing node N1 of FIG. 7. A second terminal of the capacitor C1 is electrically connected to the control terminal of the first transistor T1, the first terminal of the third transistor T3 and the second terminal of the second transistor T2.

In the embodiment of the disclosure, the first transistor T1 may be the P-type transistor, and the above other transistors may be the N-type transistors, respectively, and the first operation voltage VDD may be greater than the second operation voltage VSS, but the disclosure dose not limited thereto. In addition, the first terminal and the second terminal of the above transistor may include the drain terminal and the source terminal of the transistor, and the control terminal of the above transistor may be the gate terminal of the transistor.

Figure 11:
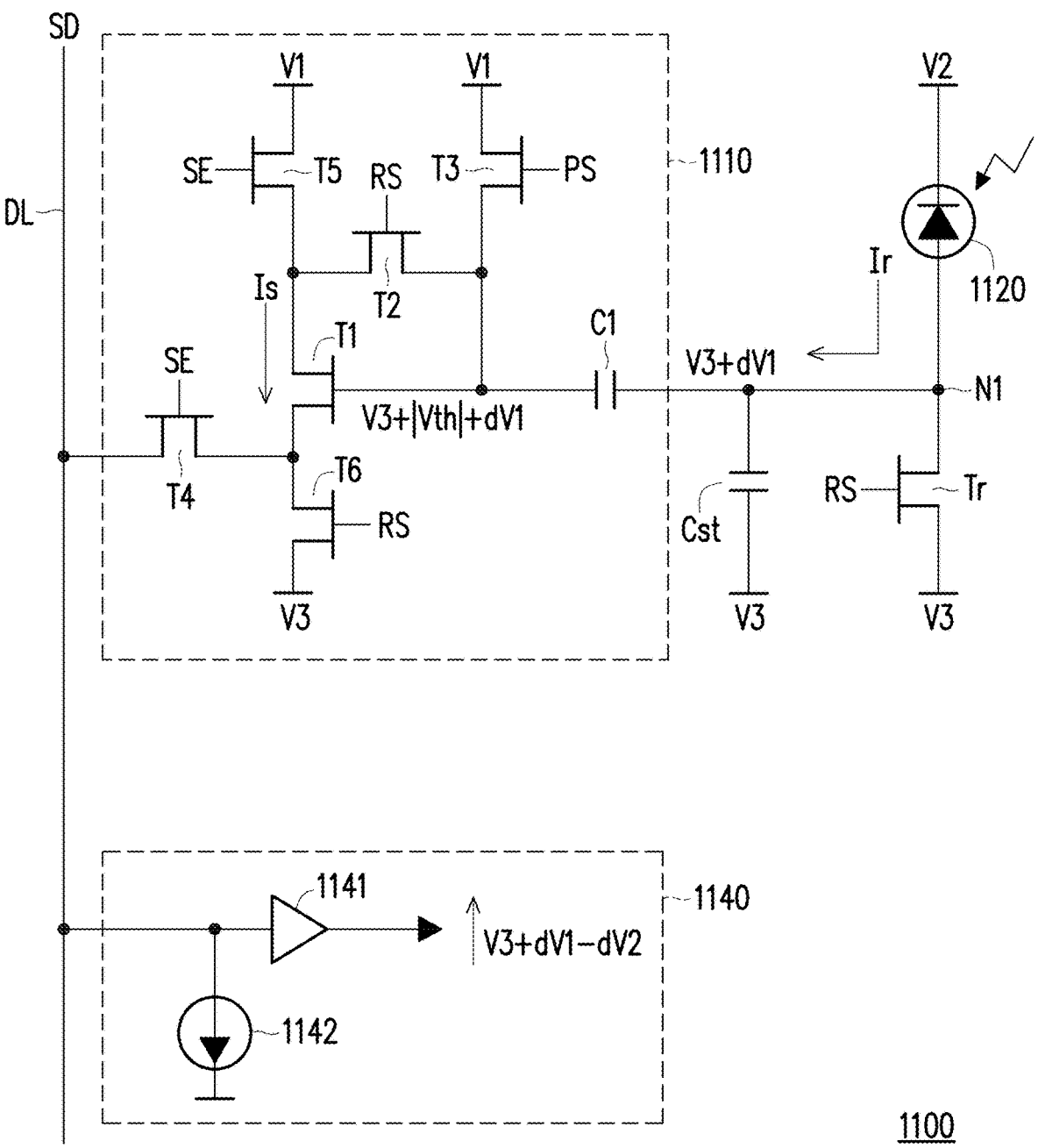
FIG. 11 is a schematic diagram of an electronic device according to an embodiment of the disclosure.

FIG. 11 is a schematic diagram of an electronic device according to an embodiment of the disclosure. Referring to FIG. 11, the electronic device 1100 includes a sensing circuit 1110, an electronic component 1120, a read-out circuit 1140, a reset transistor Tr, a storage capacitor Cst and a sense data line DL. The sensing circuit 1110 is electronically connected to the sense data line DL. The electronic component 1120 is electronically connected to the sensing circuit 1110 through a sensing node N1. A first terminal of the reset transistor Tr is electronically connected to the sensing node N1. A second terminal of the reset transistor Tr is electronically connected to an operation voltage V3 (direct current voltage). A control terminal of the reset transistor Tr is electronically connected to a reset signal RS. A first terminal of the storage capacitor Cst is electronically connected to the sensing node N1. A second terminal of the storage capacitor Cst is electronically connected to the operation voltage V3. The read-out circuit 1140 is electronically connected to the sense data line DL.

In the embodiment of the disclosure, the sensing circuit 1110 includes a first transistor T1, a second transistor T2, a third transistor T3, a fourth transistor T4, a fifth transistor T5, a sixth transistor T6 and a capacitor C1. A first terminal of the first transistor T1 is electrically connected to a first terminal of the second transistor T2. A second terminal of the second transistor T2 is electrically connected to a control terminal of the first transistor T1 and the third transistor T3. A control terminal of the second transistor T2 is electrically connected to a reset signal RS. A first terminal of the third transistor T3 is electrically connected to an operation voltage V1 (direct current voltage). A second terminal of the third transistor T3 is electrically connected to a second terminal of the second transistor T2, the control terminal of the first transistor T1 and the capacitor C1. A control terminal of the third transistor T3 is electrically connected to a preset signal PS. A first terminal of the fourth transistor T4 is electrically connected to the sense data line DL. A second terminal of the fourth transistor T4 is electrically connected to a second terminal of the first transistor T1. A control terminal of the fourth transistor T4 is electrically connected to a sense control signal SE. A first terminal of the fifth transistor T5 is electrically connected to the operation voltage V1. A second terminal of the fifth transistor T5 is electrically connected to the first terminal of the first transistor T1 and the first terminal of the second transistor T2. A control terminal of the fifth transistor T5 is electrically connected to the sense control signal SE. A first terminal of the sixth transistor T6 is electrically connected to the second terminal of the first transistor T1 and the second terminal of the fourth transistor T4. A second terminal of the sixth transistor T6 is electrically connected to the operation voltage V3. A control terminal of the sixth transistor T6 is electrically connected to the reset signal RS. A first terminal of the capacitor C1 is electrically connected to the second terminal of the third transistor T3, the second terminal of the second transistor T2 and the control terminal of the first transistor T1. A second terminal of the capacitor C1 is electrically connected to the sensing node N1.

In the embodiment of the disclosure, the electronic component 1120 is electrically connected between the sensing node N1 and an operation voltage V2 (direct current voltage). In the embodiment of the disclosure, the read-out circuit 1140 includes a voltage amplifier 1141 and a bias current source 1142. An input terminal of the voltage amplifier 1141 is electrically connected to the sense data line DL and the bias current source 1142. An output terminal of the voltage amplifier 1141 may output the sense result by receive a sense data from the sense data line DL. The bias current source 1142 is electrically connected between the input terminal of the voltage amplifier 1141 and a voltage (e.g. the second operation voltage or a ground voltage). In the embodiment of the disclosure, the operation voltage V1 is greater than the operation voltage V3, and the operation voltage V2 is greater than the operation voltage V3. The operation voltage V1, the operation voltage V2 and the operation voltage V3 may be direct current voltages, respectively.

In the embodiment of the disclosure, the electronic component 1120 may be a sensing element, such as a photodiode. A cathode terminal of the photodiode is electrically connected to the reference voltage V2. An anode terminal of the photodiode is electrically connected to the sensing node N1. The sensing circuit 1110 may be configured to sense the sensing result of the electronic component 1120, so that the read-out circuit 1140 may be configured to read-out the sensing result by the sense data line DL. In the embodiment of the disclosure, the sensing circuit 1110, the electronic component 1120, the reset transistor Tr and the storage capacitor Cst may be disposed in an active area of the electronic device 1100. The read-out circuit 1140 may be disposed in a surrounding area outside of the active area of the electronic device 1100.

In the embodiment of the disclosure, the above transistors may be N-type transistors, respectively, but the disclosure dose not limited thereto. In addition, the first terminal and the second terminal of the above transistor may include the drain terminal and the source terminal of the transistor, and the control terminal of the above transistor may be the gate terminal of the transistor.

Figure 12:
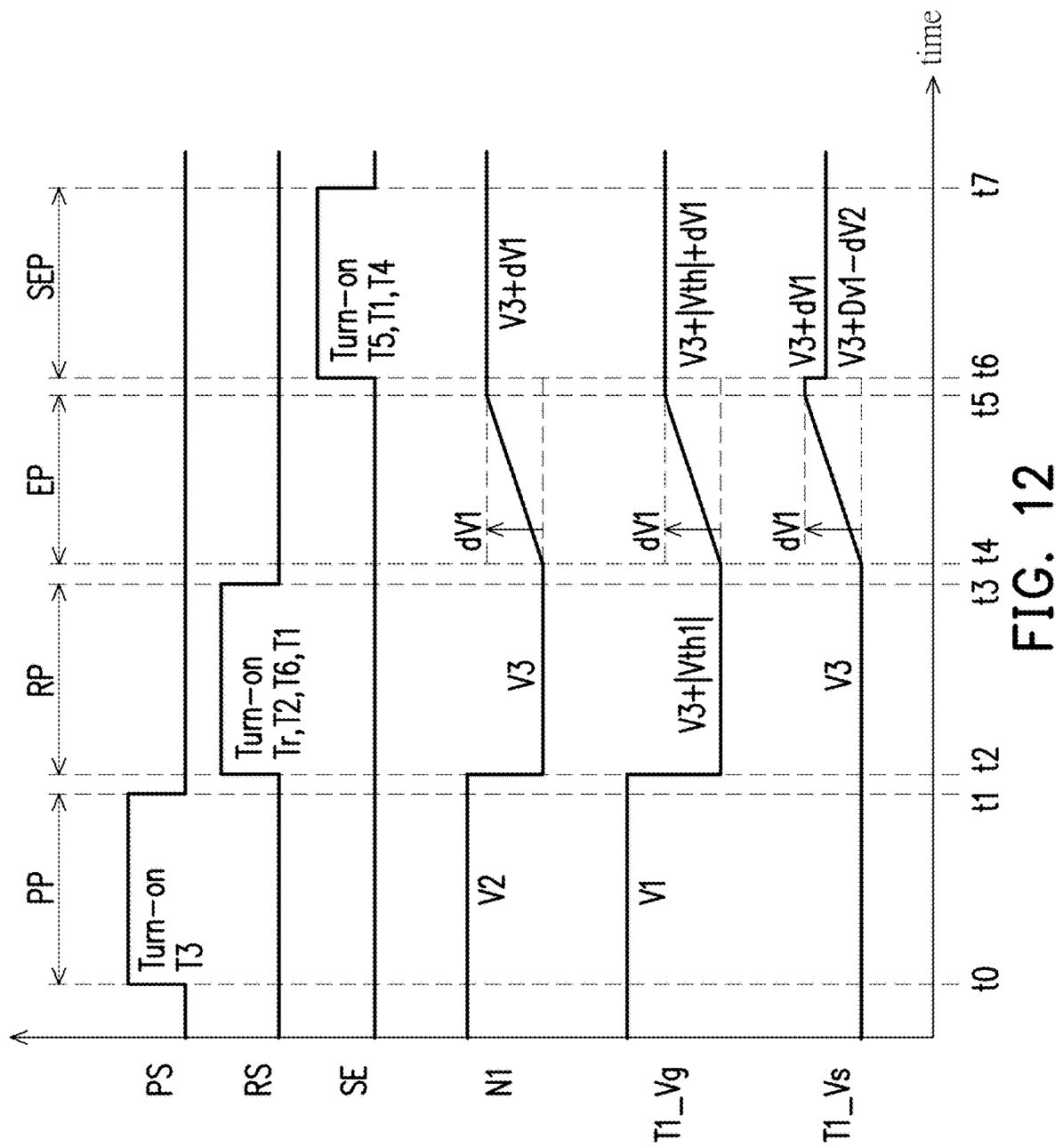
FIG. 12 is a timing diagram of related voltages and signals according to the embodiment of FIG. 11 of the disclosure.

FIG. 12 is a timing diagram of related voltages and signals according to the embodiment of FIG. 11 of the disclosure. Referring to FIG. 11 and FIG. 12, as shown as FIG. 12, the electronic device 1100 may perform a preset operation, a reset operation, an expose operation and a sense operation during a preset period PP, a reset period RP, an expose period EP and a sense period SEP. In the preset period PP from time t0 to time t1, the preset signal PS may be at a high voltage level, and the reset signal RS and the sense signal SE may be at a low voltage level. Thus, the third transistor T3 is turned-on. The voltage T1_Vg of the control terminal (gate terminal) of the first transistor T1 may be preset to the operation voltage V1. The voltage of the sensing node N1 may be the operation voltage V2 (electronic component 1120 has not yet worked).

In the reset period RP from time t2 to time t3, the reset signal RS may be at the high voltage level, and the preset signal PS and the sense signal SE may be at the low voltage level. Thus, the first transistor T1, the second transistor T2, the sixth transistor T6 and the reset transistor Tr are turned-on. The sixth transistor T6 provides the operation voltage V3 to the second terminal (source terminal) of the first transistor T1, so the voltage T1_Vs of the second terminal (source terminal) of the first transistor T1 may be the operation voltage V3. The first transistor T1 may be turned-on by the first operation voltage V1 preset in the preset period PP, and the second transistor T2 turned-on by the reset signal RS, so the voltage T1_Vg of the control terminal (gate terminal) of the first transistor T1 may be the voltage of the operation voltage V3 plus a threshold voltage |Vth1| of the first transistor T1. The voltage of the sensing node N1 may be reset to the operation voltage V3 (electronic component 1120 has not yet worked) by the reset transistor Tr.

In the expose period EP from time t4 to time t5, the reset signal RS, the preset signal PS and the sense signal SE may be at the low voltage level, respectively. The electronic component 1120 may perform the exposure operation to generate a leak current Ir. Thus, the voltage of the sensing node N1 may rise from the operation voltage V3 according to the voltage dV1 caused by the leak current Ir. The voltage T1_Vg of the control terminal (gate terminal) and the voltage T1_Vs of the second terminal (source terminal) of the first transistor T1 may also rise synchronously.

In the sense period SEP from time t6 to time t7, the sense signal SE may be changed to the high voltage level, and the preset signal PS and the reset signal RS may be at the low voltage level. Thus, the fourth transistor T4 and the fifth transistor T5 are turned-on. The fifth transistor T5 provides the first operation voltage V1 to the first transistor T1, and the first transistor T1 generates a source current Is corresponding to the voltage T1_Vg of the control terminal (gate terminal) of the first transistor T1. The fourth transistor T4 transfers the voltage T1_Vs of the second terminal (source terminal) of the first transistor T1 to the sense date line DL. The capacitor C1 may couple the voltage of the sensing node N1 to the control terminal (gate terminal) of the first transistor T1. The voltage T1_Vg of the control terminal (gate terminal) of the first transistor T1 may be the voltage of the operation voltage V3 plus the threshold voltage |Vth1| of the first transistor T1 provided by the capacitor C1 and plus the voltage dV1 coupled by the capacitor C1. The threshold voltage |Vth1| of the first transistor T1 may be compensated, so that the voltage T1_Vs of the second terminal (source terminal) of the first transistor T1 may be the voltage of the operation voltage V3 plus the voltage dV1 and minus a voltage dV2 caused by the bias current of the bias current source 1142. That is, the read-out circuit 1140 may receive the sense data signal SD from the sense date line DL, so as to read-out the voltage of the sensing node N1 for the back-end processing circuit to obtain the sensing state of the electronic component 1120 by voltage mode, and further obtain the sensing result of the electronic component 1120 by analyzing the voltage read-out result by the back-end processing circuit. Therefore, the electronic device 1100 may effectively perform the sensing operation of the electronic component 1120, and effectively read-out the sensing result of the electronic component 1120.

Figure 13:
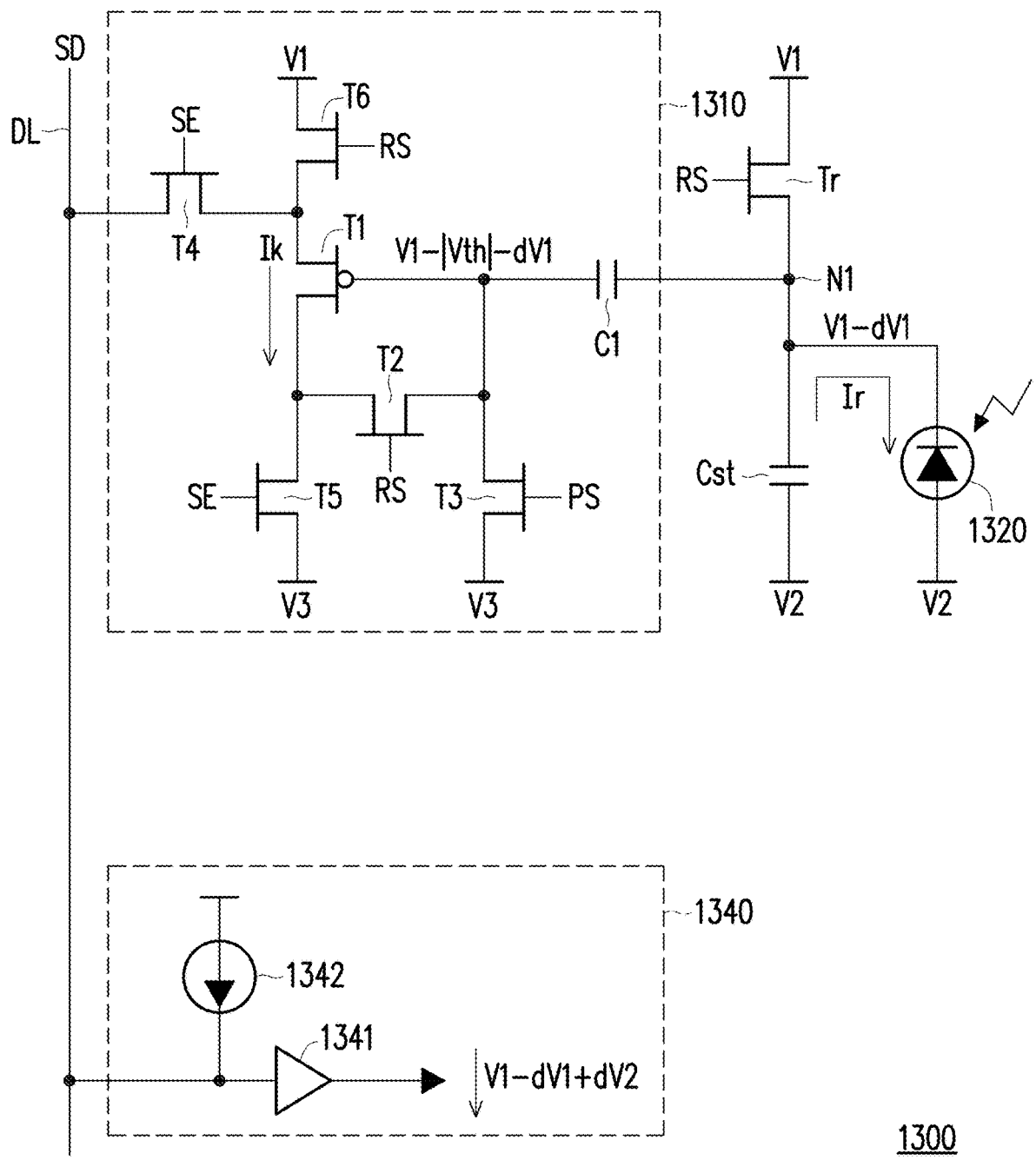
FIG. 13 is a schematic diagram of an electronic device according to an embodiment of the disclosure.

FIG. 13 is a schematic diagram of an electronic device according to an embodiment of the disclosure. Referring to FIG. 13, the electronic device 1300 includes a sensing circuit 1310, an electronic component 1320, a read-out circuit 1340, a reset transistor Tr, a storage capacitor Cst and a sense data line DL. The sensing circuit 1310 is electronically connected to the sense data line DL. The electronic component 1320 is electronically connected to the sensing circuit 1310 through a sensing node N1. A first terminal of the reset transistor Tr is electronically connected to an operation voltage V1. A second terminal of the reset transistor Tr is electronically connected to the sensing node N1. A control terminal of the reset transistor Tr is electronically connected to a reset signal RS. A first terminal of the storage capacitor Cst is electronically connected to the sensing node N1. A second terminal of the storage capacitor Cst is electronically connected to an operation voltage V2. The read-out circuit 1340 is electronically connected to the sense data line DL.

In the embodiment of the disclosure, the sensing circuit 1310 includes a first transistor T1, a second transistor T2, a third transistor T3, a fourth transistor T4, a fifth transistor T5, a sixth transistor T6 and a capacitor C1. A first terminal of the first transistor T1 is electrically connected to a first terminal of the second transistor T2 and a first terminal of the fifth transistor T5. A second terminal of the first transistor T1 is electrically connected to the fourth transistor T4 and the sixth transistor T6. A control terminal of the first transistor T1 is electrically connected to a second terminal of the second transistor T2, a first terminal of the third transistor T3 and the capacitor C1. The first terminal and the second terminal of the second transistor T2 is electrically connected between the first terminal and the control terminal of the first transistor T1. A control terminal of the second transistor T2 is electrically connected to the reset signal RS. A second terminal of the third transistor T3 is electrically connected to an operation voltage V3. A control terminal of the third transistor T3 is electrically connected to a preset signal PS. A first terminal of the fourth transistor T4 is electrically connected to the sense data line DL. A second terminal of the fourth transistor T4 is electrically connected to the second terminal of the first transistor T1. A control terminal of the fourth transistor T4 is electrically connected to a sense control signal SE. A second terminal of the fifth transistor T5 is electrically connected to the operation voltage V3. A control terminal of the fifth transistor T5 is electrically connected to the sense control signal SE. A first terminal of the sixth transistor T6 is electrically connected to the operation voltage V1. A second terminal of the sixth transistor T6 is electrically connected to the second terminal of the first transistor T1. A control terminal of the sixth transistor T6 is electrically connected to the reset signal RS. A first terminal of the capacitor C1 is electrically connected to the sensing node N1. A second terminal of the capacitor C1 is electrically connected to the second terminal of the second transistor T2 and the control terminal of the first transistor T1.

In the embodiment of the disclosure, the electronic component 1320 is electrically connected between the sensing node N1 and the operation voltage V2. In the embodiment of the disclosure, the read-out circuit 1340 includes a voltage amplifier 1341 and a bias current source 1342. An input terminal of the voltage amplifier 1341 is electrically connected to the sense data line DL and the bias current source 1342. An output terminal of the voltage amplifier 1341 may output the sense result by receive a sense data from the sense data line DL. The bias current source 1342 is electrically connected between the input terminal of the voltage amplifier 1341 and a voltage (e.g. the second operation voltage or a ground voltage). In the embodiment of the disclosure, the operation voltage V1 is greater than the operation voltage V2, and the reference voltage V1 is greater than the operation voltage V3. The operation voltage V1, the operation voltage V2 and the operation voltage V3 may be direct current voltages, respectively.

In the embodiment of the disclosure, the electronic component 1320 may be a sensing element, such as a photodiode. An anode terminal of the photodiode is electrically connected to the operation voltage V2. A cathode terminal of the photodiode is electrically connected to the sensing node N1. The sensing circuit 1310 may be configured to sense the sensing result of the electronic component 1320, so that the read-out circuit 1340 may be configured to read-out the sensing result by the sense data line DL. In the embodiment of the disclosure, the sensing circuit 1310, the electronic component 1320, the reset transistor Tr and the storage capacitor Cst may be disposed in an active area of the electronic device 1300. The read-out circuit 1340 may be disposed in a surrounding area outside of the active area of the electronic device 1300.

In the embodiment of the disclosure, the first transistor T1 may be a P-type transistor, and the above other transistors may be the N-type transistors, respectively, but the disclosure dose not limited thereto. In addition, the first terminal and the second terminal of the above transistor may include the drain terminal and the source terminal of the transistor, and the control terminal of the above transistor may be the gate terminal of the transistor.

Figure 14:
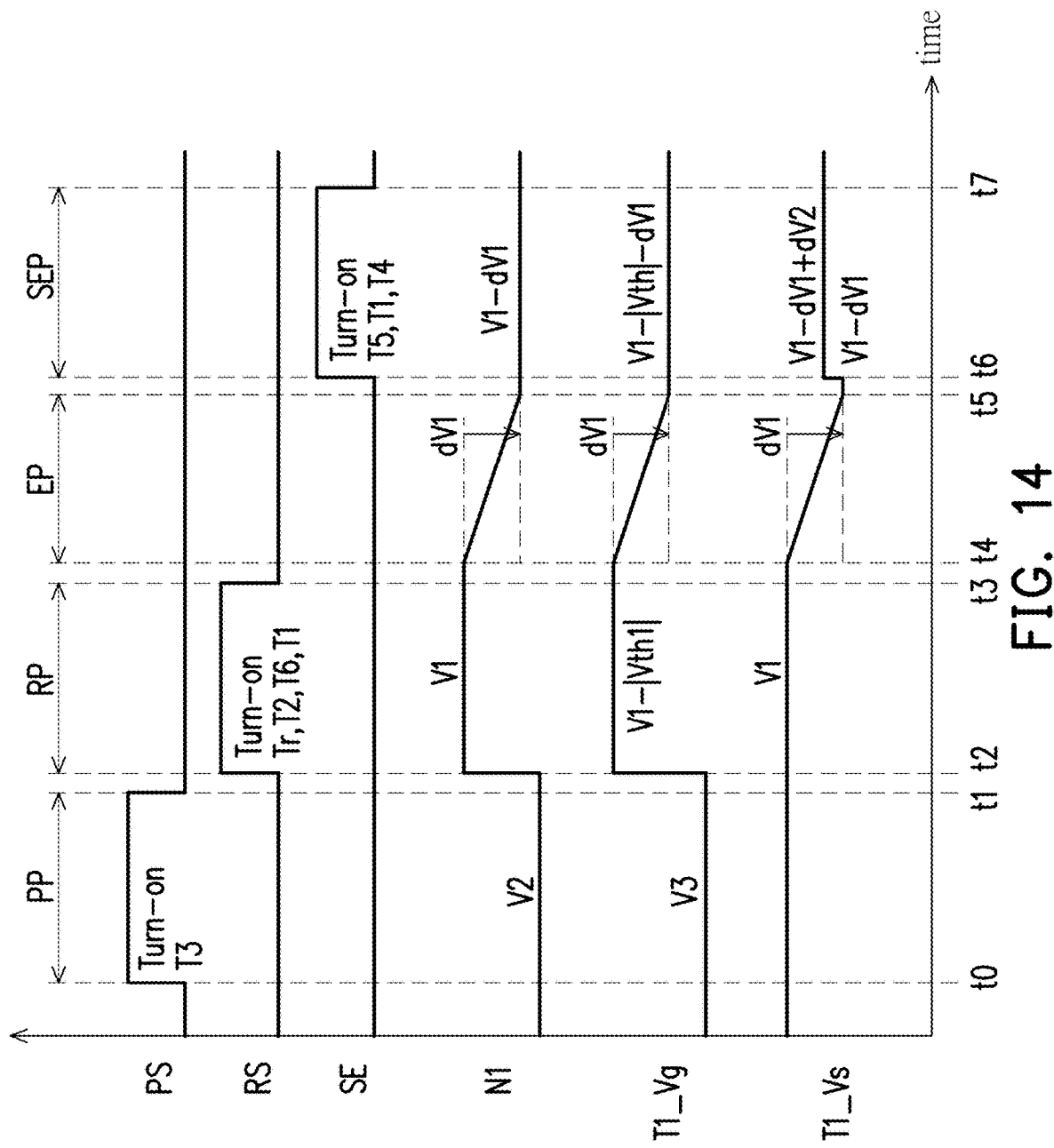
FIG. 14 is a timing diagram of related voltages and signals according to the embodiment of FIG. 13 of the disclosure.

FIG. 14 is a timing diagram of related voltages and signals according to the embodiment of FIG. 13 of the disclosure. Referring to FIG. 13 and FIG. 14, as shown as FIG. 14, the electronic device 1300 may perform a preset operation, a reset operation, an expose operation and a sense operation during a preset period PP, a reset period RP, an expose period EP and a sense period SEP. In the preset period PP from time t0 to time t1, the preset signal PS may be at a high voltage level, and the reset signal RS and the sense signal SE may be at a low voltage level. Thus, the third transistor T3 is turned-on. The voltage T1_Vg of the control terminal (gate terminal) of the first transistor T1 may be preset to the operation voltage V3. The voltage of the sensing node N1 may be the operation voltage V2 (electronic component 1320 has not yet worked).

In the reset period RP from time t2 to time t3, the reset signal RS may be at the high voltage level, and the preset signal PS and the sense signal SE may be at the low voltage level. Thus, the first transistor T1, the second transistor T2, the sixth transistor T6 and the reset transistor Tr are turned-on. The sixth transistor T6 provides the operation voltage V1 to the second terminal (source terminal) of the first transistor T1, so the voltage T1_Vs of the second terminal (source terminal) of the first transistor T1 may be the operation voltage V1. The first transistor T1 may be turned-on by the operation voltage V3 reset in the preset period PP, and the second transistor T2 turned-on by the reset signal RS, so the voltage T1_Vg of the control terminal (gate terminal) of the first transistor T1 may be the voltage of the operation voltage V1 minus a threshold voltage |Vth1| of the first transistor T1. The voltage of the sensing node N1 may be reset to the operation voltage V1 (electronic component 1320 has not yet worked) by the reset transistor Tr.

In the expose period EP from time t4 to time t5, the reset signal RS, the preset signal PS and the sense signal SE may be at the low voltage level, respectively. The electronic component 1320 may perform the exposure operation to generate a leak current Ir. Thus, the voltage of the sensing node N1 may drop from the operation voltage V1 according to the voltage dV1 caused by the leak current Ir. The voltage T1_Vg of the control terminal (gate terminal) and the voltage T1_Vs of the second terminal (source terminal) of the first transistor T1 may also drop synchronously.

In the sense period SEP from time t6 to time t7, the sense signal SE may be changed to the high voltage level, and the preset signal PS and the reset signal RS may be at the low voltage level. Thus, the fourth transistor T4 and the fifth transistor T5 are turned-on. The fifth transistor T5 provides the operation voltage V3 to the first transistor T1, and the first transistor T1 generates a sink current Ik corresponding to the voltage T1_Vg of the control terminal (gate terminal) of the first transistor T1. The fourth transistor T4 transfers the voltage T1_Vs of the second terminal (source terminal) of the first transistor T1 to the sense date line DL. The capacitor C1 may couple the voltage of the sensing node N1 to the control terminal (gate terminal) of the first transistor T1. The voltage T1_Vg of the control terminal (gate terminal) of the first transistor T1 may be the voltage of the operation voltage V1 minus the threshold voltage |Vth1| of the first transistor T1 provided by the capacitor C1 and minus the voltage dV1 coupled by the capacitor C1. The threshold voltage |Vth1| of the first transistor T1 may be compensated, so that the voltage T1_Vs of the second terminal (source terminal) of the first transistor T1 may be the voltage of the operation voltage V1 minus the voltage dV1 and plus a voltage dV2 caused by the bias current of the bias current source 1342. That is, the read-out circuit 1340 may receive the sense data signal SD from the sense date line DL, so as to read-out the voltage of the sensing node N1 for the back-end processing circuit to obtain the sensing state of the electronic component 1320 by voltage mode, and further obtain the sensing result of the electronic component 1320 by analyzing the voltage read-out result by the back-end processing circuit. Therefore, the electronic device 1300 may effectively perform the sensing operation of the electronic component 1320, and effectively read-out the sensing result of the electronic component 1320.

Figure 15:
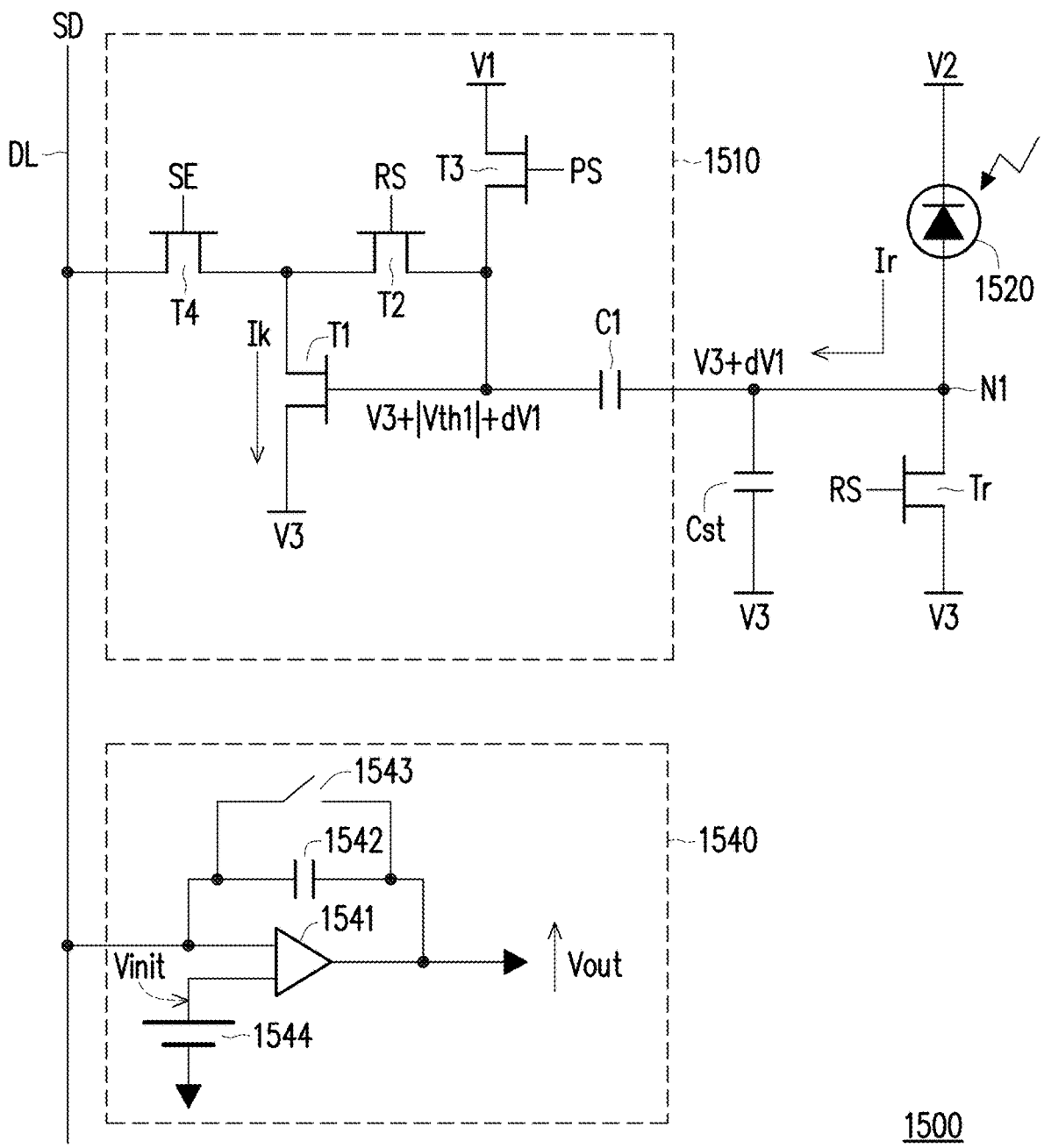
FIG. 15 is a schematic diagram of an electronic device according to an embodiment of the disclosure.

FIG. 15 is a schematic diagram of an electronic device according to an embodiment of the disclosure. Referring to FIG. 15, the electronic device 1500 includes a sensing circuit 1510, an electronic component 1520, a read-out circuit 1540 and a sense data line DL. The sensing circuit 1510 is electronically connected to the sense data line DL. The electronic component 1520 is electronically connected to the sensing circuit 1510 through a sensing node N1. A first terminal of the reset transistor Tr is electronically connected to the sensing node N1. A second terminal of the reset transistor Tr is electronically connected to an operation voltage V3. A control terminal of the reset transistor Tr is electronically connected to a reset signal RS. A first terminal of the storage capacitor Cst is electronically connected to the sensing node N1. A second terminal of the storage capacitor Cst is electronically connected to the operation voltage V3. The read-out circuit 1540 is electronically connected to the sense data line DL.

In the embodiment of the disclosure, the sensing circuit 1510 includes a first transistor T1, a second transistor T2, a third transistor T3, a fourth transistor T4 and a capacitor C1. A first terminal of the first transistor T1 is electrically connected to the second transistor T2 and the fourth transistor T4. A second terminal of the first transistor T1 is electrically connected to the operation voltage V3. A control terminal of the first transistor T1 is electrically connected to the second transistor T2, the third transistor T3 and the capacitor C1. A first terminal of the second transistor T2 is electrically connected to the first terminal of the first transistor T1 and the fourth transistor T4. A second terminal of the second transistor T2 is electrically connected to the control terminal of the first transistor T1 and the third transistor T3. The second transistor T2 is electrically connected between the first terminal and the control terminal of the first transistor T1. A control terminal of the second transistor T2 is electrically connected to a reset signal RS. A first terminal of the third transistor T3 is electrically connected to an operation voltage V1. A second terminal of the third transistor T3 is electrically connected to the second terminal of the second transistor T2, a control terminal of the first transistor T1 and the capacitor C1. A control terminal of the third transistor T3 is electrically connected to a preset signal PS. A first terminal of the fourth transistor T4 is electrically connected to the sense data line DL. A second terminal of the fourth transistor T4 is electrically connected to the first terminal of the first transistor T1. A control terminal of the fourth transistor T4 is electrically connected to a sense control signal SE. A first terminal of the capacitor C1 is electrically connected to the sensing node N1. A second terminal of the capacitor C1 is electrically connected to the second terminal of the second transistor T2, the control terminal of the first transistor T1 and the second terminal of the third transistor T3.

In the embodiment of the disclosure, the electronic component 1520 is electrically connected between the sensing node N1 and an operation voltage V2. In the embodiment of the disclosure, the read-out circuit 1540 includes an operational amplifier 1541, a capacitor 1542, a switch 1543 and a reference voltage 1544 to form a charge integrator. A first input terminal of the operational amplifier 1541 is electrically connected to the sense data line DL. A second input terminal of the operational amplifier 1541 is electrically connected to the reference voltage 1544. The capacitor 1542 is electrically connected between the first input terminal and an output terminal of the operational amplifier 1541. The switch 1543 is electrically connected between the first input terminal and an output terminal of the operational amplifier 1541. The output terminal of the operational amplifier 1541 may output the sense result by receive a sense data from the sense data line DL. The reference voltage 1544 is electrically connected between the second input terminal of the operational amplifier 1541 and a voltage (e.g. the second operation voltage or a ground voltage). In the embodiment of the disclosure, the operation voltage V1 is greater than the operation voltage V3, and the operation voltage V2 is greater than the operation voltage V3. The operation voltage V1, the operation voltage V2 and the operation voltage V3 may be direct current voltages, respectively.

In the embodiment of the disclosure, the electronic component 1520 may be a sensing element, such as a photodiode. A cathode terminal of the photodiode is electrically connected to the operation voltage V2. An anode terminal of the photodiode is electrically connected to the sensing node N1. The sensing circuit 1510 may be configured to sense the sensing result of the electronic component 1520, so that the read-out circuit 1540 may be configured to read-out the sensing result by the sense data line DL. In the embodiment of the disclosure, the sensing circuit 1510, the electronic component 1520, the reset transistor Tr and the storage capacitor Cst may be disposed in an active area of the electronic device 1500. The read-out circuit 1540 may be disposed in a surrounding area outside of the active area of the electronic device 1500.

In the embodiment of the disclosure, the above transistors may be the N-type transistors, respectively, but the disclosure dose not limited thereto. In addition, the first terminal and the second terminal of the above transistor may include the drain terminal and the source terminal of the transistor, and the control terminal of the above transistor may be the gate terminal of the transistor.

Figure 16:
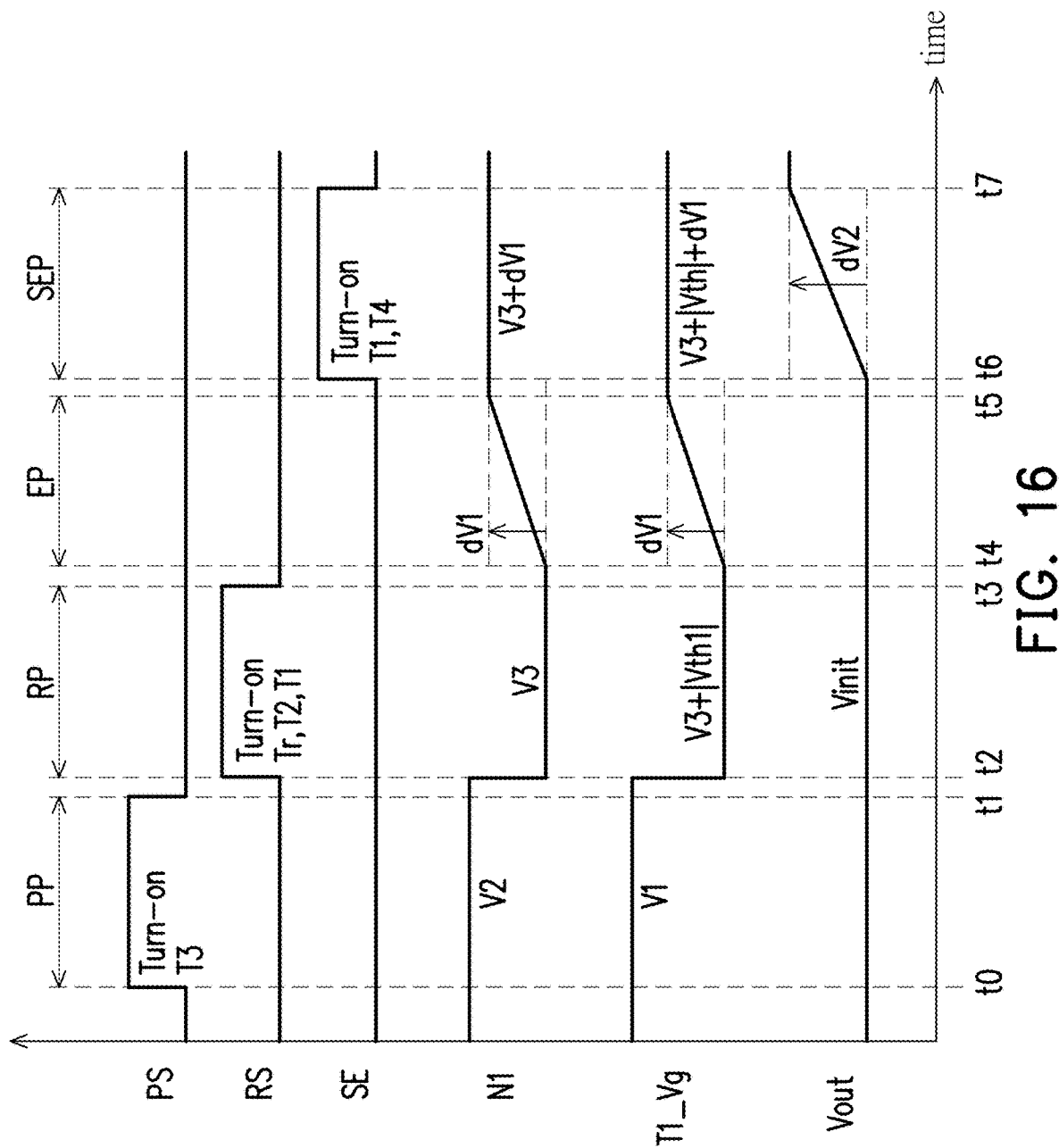
FIG. 16 is a timing diagram of related voltages and signals according to the embodiment of FIG. 15 of the disclosure.

FIG. 16 is a timing diagram of related voltages and signals according to the embodiment of FIG. 15 of the disclosure. Referring to FIG. 15 and FIG. 16, as shown as FIG. 16, the electronic device 1500 may perform a preset operation, a reset operation, an expose operation and a sense operation during a preset period PP, a reset period RP, an expose period EP and a sense period SEP. In the preset period PP from time t0 to time t1, the preset signal PS may be at a high voltage level, and the reset signal RS and the sense signal SE may be at a low voltage level. Thus, the third transistor T3 is turned-on. The voltage T1_Vg of the control terminal (gate terminal) of the first transistor T1 may be preset to the operation voltage V1. The voltage of the sensing node N1 may be the operation voltage V2 (electronic component 1520 has not yet worked).

In the reset period RP from time t2 to time t3, the reset signal RS may be at the high voltage level, and the preset signal PS and the sense signal SE may be at the low voltage level. Thus, the first transistor T1, the second transistor T2 and the reset transistor Tr are turned-on. The voltage of the second terminal (source terminal) of the first transistor T1 may be the operation voltage V3. The first transistor T1 may be turned-on by the first operation voltage V1 preset in preset period, and the second transistor T2 turned-on by the reset signal RS, so the voltage T1_Vg of the control terminal (gate terminal) of the first transistor T1 may be the voltage of the operation voltage V3 plus a threshold voltage |Vth1| of the first transistor T1. The voltage of the sensing node N1 may be reset to the operation voltage V3 (electronic component 1520 has not yet worked) by the reset transistor Tr.

In the expose period EP from time t4 to time t5, the reset signal RS, the preset signal PS and the sense signal SE may be at the low voltage level, respectively. The electronic component 1520 may perform the exposure operation to generate a leak current Ir. Thus, the voltage of the sensing node N1 may rise from the operation voltage V3 according to the voltage dV1 caused by the leak current Ir. The voltage T1_Vg of the control terminal (gate terminal) of the first transistor T1 may also rise synchronously.

In the sense period SEP from time t6 to time t7, the sense signal SE may be changed to the high voltage level, and the preset signal PS and the reset signal RS may be at the low voltage level. Thus, the fourth transistor T4 is turned-on. The first transistor T1 generates a sink current Ik corresponding to the voltage T1_Vg of the control terminal (gate terminal) of the first transistor T1, and the fourth transistor T4 transfers the sink current Ik to the sense data line DL. The capacitor C1 may couple the voltage of the sensing node N1 to the control terminal (gate terminal) of the first transistor T1. The voltage T1_Vg of the control terminal (gate terminal) of the first transistor T1 may be the voltage of the operation voltage V3 plus the threshold voltage |Vth1| of the first transistor T1 provided by the capacitor C1 and plus the voltage dV1 coupled by the capacitor C1. The threshold voltage |Vth1| of the first transistor T1 may be compensated, so that the first transistor T1 generates the sink current Ik corresponding to the voltage of the operation voltage V3 plus the voltage dV1. The fourth transistor T4 transfers the sink current Ik to the sense date line DL. It should be noted that the sink current Ik corresponds to the voltage of the sensing node N1, and the voltage of the sensing node N1 corresponds to the leak current Ir flowing through the electronic component 1520. The first input terminal of the operational amplifier 1541 may receive the sense data signal SD with the sink current Ik from the sense date line DL, and output an output voltage Vout by integrating the sink current Ik. Thus, the output voltage Vout may rise from a low voltage level of an initial voltage Vinit to a high voltage level based on a voltage dV2 caused by the sink current Ik. That is, the read-out circuit 1540 may receive the sense data signal SD from the sense date line DL, so as to read-out the voltage of the sensing node N1 for the back-end processing circuit to obtain the sensing state of the electronic component 1520 by current mode (ie, the sink current Ik is converted to voltage by the charge integrator), and further obtain the sensing result of the electronic component 1520 by analyzing the voltage read-out result by the back-end processing circuit. Therefore, the electronic device 1500 may effectively perform the sensing operation of the electronic component 1520, and effectively read-out the sensing result of the electronic component 1520.

Figure 17:
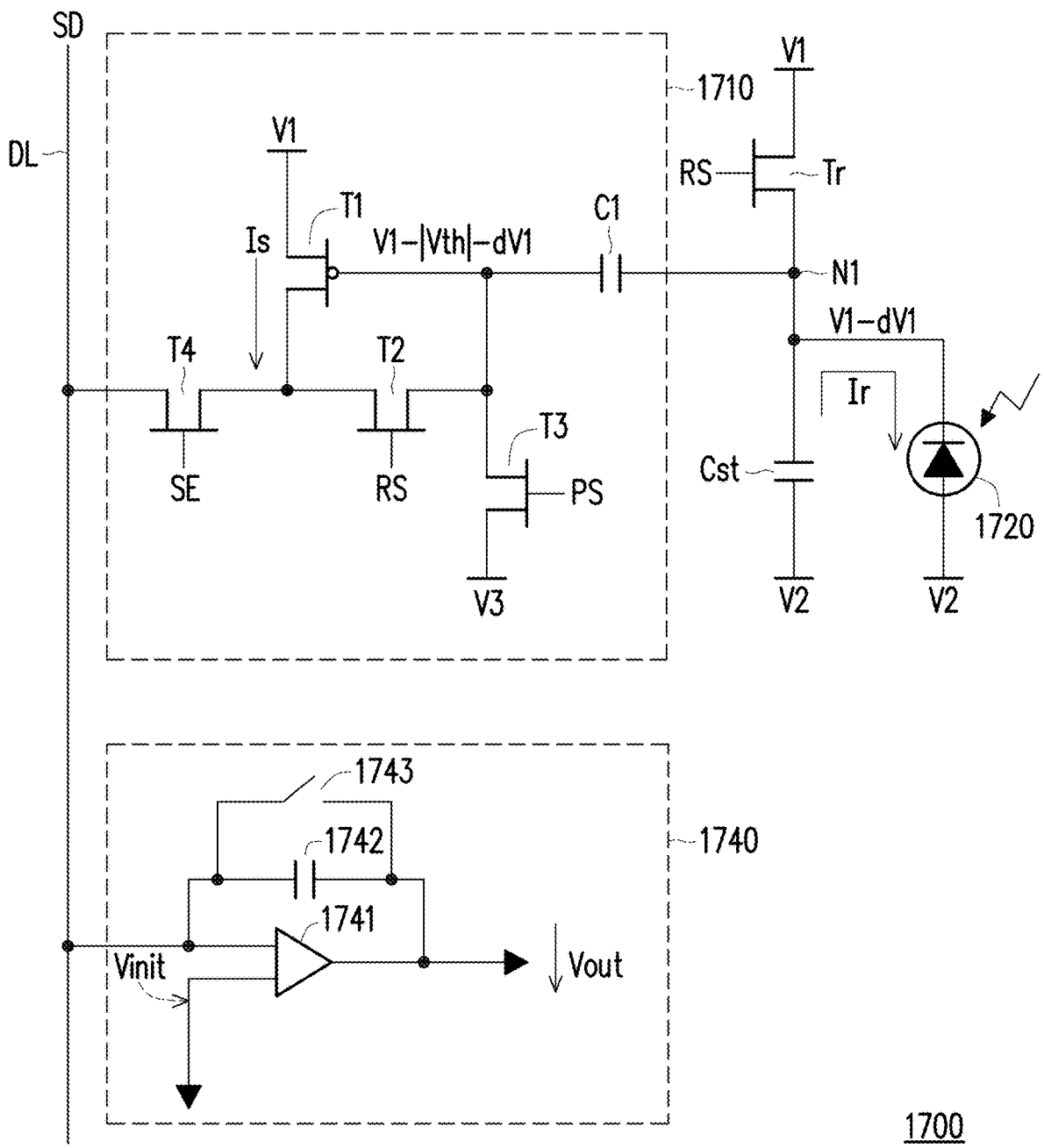
FIG. 17 is a schematic diagram of an electronic device according to an embodiment of the disclosure.

FIG. 17 is a schematic diagram of an electronic device according to an embodiment of the disclosure. Referring to FIG. 17, the electronic device 1700 includes a sensing circuit 1710, an electronic component 1720, a read-out circuit 1740, a reset transistor Tr, a storage capacitor Cst and a sense data line DL. The sensing circuit 1710 is electronically connected to the sense data line DL. The electronic component 1720 is electronically connected to the sensing circuit 1710 through a sensing node N1. A first terminal of the reset transistor Tr is electronically connected to an operation voltage V1. A second terminal of the reset transistor Tr is electronically connected to the sensing node N1. A control terminal of the reset transistor Tr is electronically connected to a reset signal RS. A first terminal of the storage capacitor Cst is electronically connected to the sensing node N1. A second terminal of the storage capacitor Cst is electronically connected to the operation voltage V2. The read-out circuit 1740 is electronically connected to the sense data line DL.

In the embodiment of the disclosure, the sensing circuit 1710 includes a first transistor T1, a second transistor T2, a third transistor T3, a fourth transistor T4 and a capacitor C1. A first terminal of the first transistor T1 is electrically connected to the second transistor T2 and the fourth transistor T4. A second terminal of the first transistor T1 is electrically connected to the operation voltage V1. A control terminal of the first transistor T1 is electrically connected to the second transistor T2 and the third transistor T3. A first terminal of the second transistor T2 is electrically connected to the first terminal of the first transistor T1 and the fourth transistor T4. A second terminal of the second transistor T2 is electrically connected to the control terminal of the first transistor T1 and a first terminal of the third transistor T3. The second transistor T2 is electrically connected between the first terminal and the control terminal of the first transistor T1. A control terminal of the second transistor T2 is electrically connected to a reset signal RS. A second terminal of the third transistor T3 is electrically connected to an operation voltage V3. A control terminal of the third transistor T3 is electrically connected to a preset signal PS. A first terminal of the fourth transistor T4 is electrically connected to the sense data line DL. A second terminal of the fourth transistor T4 is electrically connected to the first terminal of the first transistor T1 and the first terminal of the second transistor T2. A control terminal of the fourth transistor T4 is electrically connected to a sense control signal SE. A first terminal of the capacitor C1 is electrically connected to the sensing node N1. A second terminal of the capacitor C1 is electrically connected to the second terminal of the second transistor T2, the control terminal of the first transistor T1 and the first terminal of the third transistor T3.

In the embodiment of the disclosure, the electronic component 1720 is electrically connected between the sensing node N1 and an operation voltage V2. In the embodiment of the disclosure, the read-out circuit 1740 includes an operational amplifier 1741, a capacitor 1742 and a switch 1743 to form a charge integrator. A first input terminal of the operational amplifier 1741 is electrically connected to the sense data line DL. A second input terminal of the operational amplifier 1741 is electrically connected to a voltage (e.g. the second operation voltage or a ground voltage). The capacitor 1742 is electrically connected between the first input terminal and an output terminal of the operational amplifier 1741. The switch 1743 is electrically connected between the first input terminal and the output terminal of the operational amplifier 1741. The output terminal of the operational amplifier 1741 may output the sense result by receive a sense data from the sense data line DL. In the embodiment of the disclosure, the operation voltage V1 is greater than the operation voltage V2, and the operation voltage V1 is greater than the operation voltage V3. The operation voltage V1, the operation voltage V2 and the operation voltage V3 may be direct current voltages, respectively.

In the embodiment of the disclosure, the electronic component 1720 may be a sensing element, such as a photodiode. An anode terminal of the photodiode is electrically connected to the operation voltage V2. A cathode terminal of the photodiode is electrically connected to the sensing node N1. The sensing circuit 1710 may be configured to sense the sensing result or the test result of the electronic component 1720, so that the read-out circuit 1740 may be configured to read-out the sensing result by the sense data line DL. In the embodiment of the disclosure, the sensing circuit 1710, the electronic component 1720, the reset transistor Tr and the storage capacitor Cst may be disposed in an active area of the electronic device 1700. The read-out circuit 1740 may be disposed in a surrounding area outside of the active area of the electronic device 1700.

In the embodiment of the disclosure, the first transistor T1 may be the P-type transistor, and the above other transistors may be the N-type transistors, respectively, but the disclosure dose not limited thereto. In addition, the first terminal and the second terminal of the above transistor may be the drain terminal and the source terminal of the transistor, and the control terminal of the above transistor may be the gate terminal of the transistor.

Figure 18:
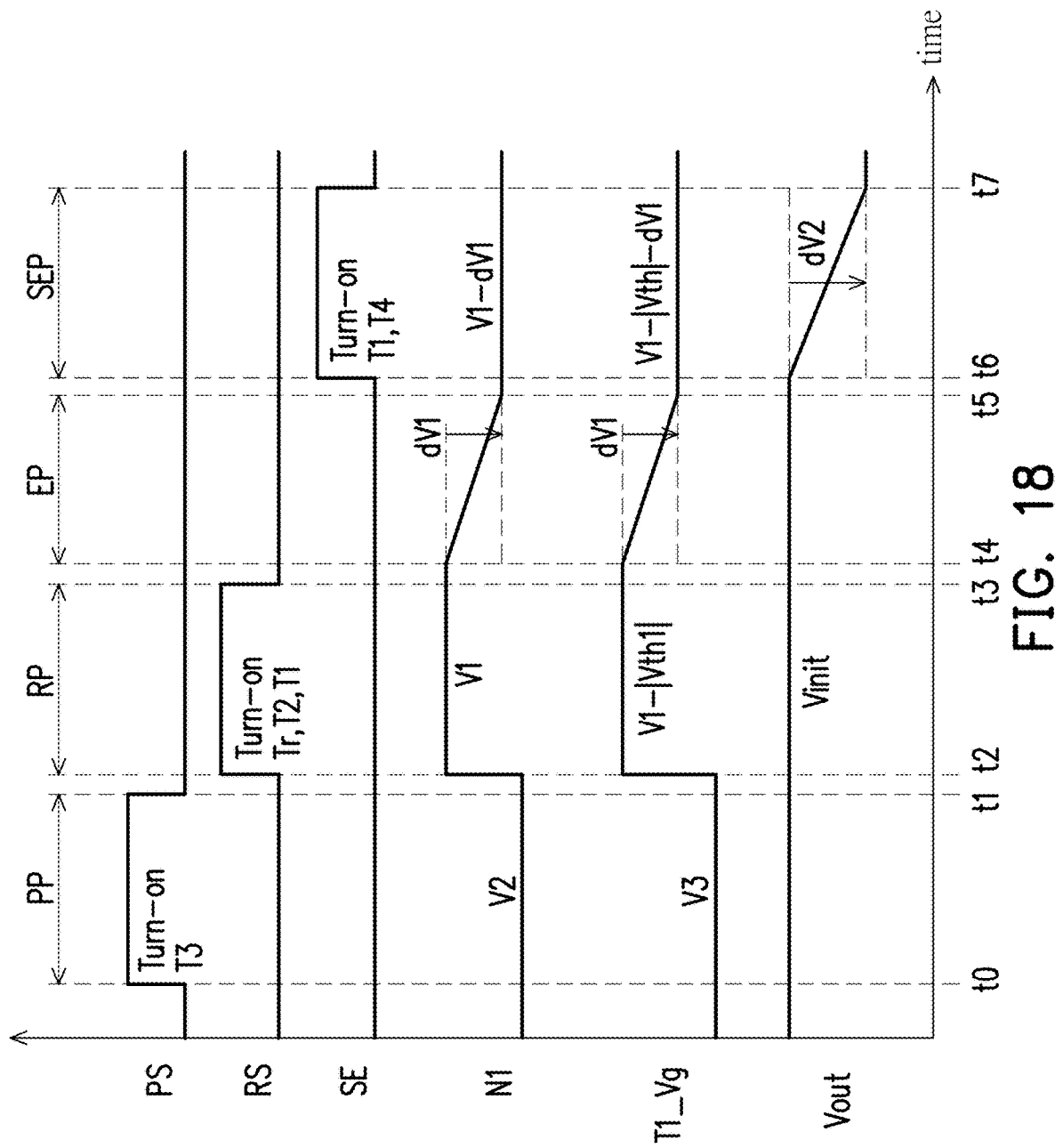
FIG. 18 is a timing diagram of related voltages and signals according to the embodiment of FIG. 17 of the disclosure.

FIG. 18 is a timing diagram of related voltages and signals according to the embodiment of FIG. 17 of the disclosure. Referring to FIG. 17 and FIG. 18, as shown as FIG. 18, the electronic device 1700 may perform a preset operation, a reset operation, an expose operation and a sense operation during a preset period PP, a reset period RP, an expose period EP and a sense period SEP. In the preset period PP from time t0 to time t1, the preset signal PS may be at a high voltage level, and the reset signal RS and the sense signal SE may be at a low voltage level. Thus, the third transistor T3 is turned-on. The voltage T1_Vg of the control terminal (gate terminal) of the first transistor T1 may be preset to the operation voltage V3. The voltage of the sensing node N1 may be the operation voltage V2 (electronic component 1720 has not yet worked).

In the reset period RP from time t2 to time t3, the reset signal RS may be at the high voltage level, and the preset signal PS and the sense signal SE may be at the low voltage level. Thus, the first transistor T1, the second transistor T2 and the reset transistor Tr are turned-on. The voltage of the second terminal (source terminal) of the first transistor T1 may be the operation voltage V1. The first transistor T1 may be turned-on by the operation voltage V3 preset in the preset period PP, and the second transistor T2 turned-on by the reset signal RS, so the voltage T1_Vg of the control terminal (gate terminal) of the first transistor T1 may be the voltage of the operation voltage V3 minus a threshold voltage |Vth1| of the first transistor T1. The voltage of the sensing node N1 may be reset to the operation voltage V1 (electronic component 1720 has not yet worked) by the reset transistor Tr.

In the expose period EP from time t4 to time t5, the reset signal RS, the preset signal PS and the sense signal SE may be at the low voltage level, respectively. The electronic component 1720 may perform the exposure operation to generate a leak current Ir. Thus, the voltage of the sensing node N1 may drop from the operation voltage V1 according to the voltage dV1 caused by the leak current Ir. The voltage T1_Vg of the control terminal (gate terminal) of the first transistor T1 may also drop synchronously.

In the sense period SEP from time t6 to time t7, the sense signal SE may be changed to the high voltage level, and the preset signal PS and the reset signal RS may be at the low voltage level. Thus, the fourth transistor T4 is turned-on. The first transistor T1 generates the source current Is corresponding to the voltage T1_Vg of the control terminal (gate terminal) of the first transistor T1, and the fourth transistor T4 transfers the source current Is to the sense data line DL. The capacitor C1 may couple the voltage of the sensing node N1 to the control terminal (gate terminal) of the first transistor T1. The voltage T1_Vg of the control terminal (gate terminal) of the first transistor T1 may be the voltage of the operation voltage V1 minus the threshold voltage |Vth1| of the first transistor T1 provided by the capacitor C1 and minus the voltage dV1 coupled by the capacitor C1. The threshold voltage |Vth1| of the first transistor T1 may be compensated, so that the first transistor T1 generates the source current Is corresponding to the voltage of the operation voltage V1 minus the voltage dV1. The fourth transistor T4 transfers the source current Is to the sense date line DL. It should be noted that the source current Is corresponds to the voltage of the sensing node N1, and the voltage of the sensing node N1 corresponds to the leak current Ir flowing through the electronic component 1720. The first input terminal of the operational amplifier 1741 may receive the sense data signal SD with the source current Is from the sense date line DL, and output an output voltage Vout by integrating the source current Is. Thus, the output voltage Vout may drop from a high voltage level of an initial voltage Vinit to a low voltage level based on a voltage dV2 caused by the source current Is. That is, the read-out circuit 1740 may receive the sense data signal SD from the sense date line DL, so as to read-out the voltage of the sensing node N1 for the back-end processing circuit to obtain the sensing result of the electronic component 1420 by current mode (ie, the source current Is is converted to voltage by the charge integrator), and further obtain the sensing result of the electronic component 1720 by analyzing the voltage read-out result by the back-end processing circuit. Therefore, the electronic device 1700 may effectively perform the sensing operation of the electronic component 1720, and effectively read-out the sensing result of the electronic component 1720.

In summary, the electronic device of the disclosure can effectively drive, test or sense the electronic component by the sensing circuit, and the driving, test or sensing result sensed by the sensing circuit can be effectively read-out by the read-out circuit. Moreover, the electronic device of some embodiments of the disclosure may have the compensation function of the threshold voltage of the transistor to achieve better sense data readout effect.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
   an electronic component;
   a sensing circuit, electrically connected to the electronic component through a sensing node, and the sensing circuit comprising:
      a first transistor;
      a second transistor, wherein a control terminal of the first transistor is electrically connected to a terminal of the second transistor, and a terminal of the first transistor is electrically connected to another terminal of the second transistor;
      a third transistor, wherein a terminal of the third transistor is electrically connected to the first transistor;
      a fifth transistor T5, wherein a terminal of the fifth transistor is electrically connected to the terminal of the first transistor and the another terminal of the second transistor; and
      a sixth transistor T6, wherein a terminal of the sixth transistor is electrically connected to another terminal of the first transistor;
   a driving circuit, electrically connected to the electronic component and the sensing circuit through the sensing node, wherein the driving circuit comprises a compensation transistor.

2. The electronic device according to claim 1, wherein the control terminal of the first transistor is electrically connected to the sensing node.

3. The electronic device according to claim 1, wherein another terminal of the third transistor receives a data signal.

4. The electronic device according to claim 3, wherein the another terminal of the third transistor is electrically connected to a read-out circuit.

5. The electronic device according to claim 4, wherein the read-out circuit is disposed in a surrounding area outside of an active area of the electronic device.

6. The electronic device according to claim 1, wherein the sensing circuit further comprises a fourth transistor, and the control terminal of the first transistor is electrically connected to a terminal of the fourth transistor.

7. The electronic device according to claim 1, wherein the another terminal of the first transistor is electrically connected to the terminal of the third transistor.

8. The electronic device according to claim 1, wherein the terminal of the sixth transistor is electrically connected to the terminal of the third transistor.

* * * * *